(12) United States Patent
Yu et al.

(10) Patent No.: US 9,336,851 B2
(45) Date of Patent: May 10, 2016

(54) MEMORY DEVICE AND METHOD OF REFRESHING IN A MEMORY DEVICE

(71) Applicant: Samsung Electronics Co., Ltd.

(72) Inventors: Hak-Soo Yu, Seongnam-si (KR); Jung-Bae Lee, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 80 days.

(21) Appl. No.: 14/168,793

(22) Filed: Jan. 30, 2014

(65) Prior Publication Data

US 2014/0219042 A1    Aug. 7, 2014

(30) Foreign Application Priority Data

Feb. 7, 2013 (KR) .......... 10-2013-0013707

(51) Int. Cl.
*G11C 11/406* (2006.01)

(52) U.S. Cl.
CPC ........ *G11C 11/406* (2013.01); *G11C 11/40603* (2013.01)

(58) Field of Classification Search
USPC ....................................................... 365/222
See application file for complete search history.

(56) References Cited

U.S. PATENT DOCUMENTS

| | | | |
|---|---|---|---|
| 6,912,168 B2 | 6/2005 | Parris et al. | |
| 6,944,081 B2 | 9/2005 | Takahashi et al. | |
| 7,692,993 B2 | 4/2010 | Iida et al. | |
| 8,072,829 B2 | 12/2011 | Kim | |
| 2005/0249010 A1 | 11/2005 | Klein | |
| 2006/0112217 A1* | 5/2006 | Walker ................ | G06F 13/1636 711/106 |
| 2007/0195627 A1* | 8/2007 | Kim ..................... | G11C 11/406 365/222 |
| 2014/0006703 A1* | 1/2014 | Bains ................ | G11C 11/40618 711/106 |
| 2014/0016422 A1* | 1/2014 | Kim et al. ................... | 365/222 |

FOREIGN PATENT DOCUMENTS

| | | |
|---|---|---|
| JP | 2001-093278 A | 4/2001 |
| JP | 2006-286149 A1 | 10/2006 |
| JP | 2009-059412 A | 3/2009 |
| KR | 10-0656425 B1 | 12/2006 |
| KR | 2007-105769 A | 10/2007 |

* cited by examiner

*Primary Examiner* — Anthan Tran
*Assistant Examiner* — Mushfique Siddique
(74) *Attorney, Agent, or Firm* — Muir Patent Law, PLLC

(57) ABSTRACT

In a method of refreshing in a memory device having a plurality of pages, a candidate refresh address corresponding to a page scheduled to be refreshed after a monitoring period is generated. Whether an active command is processed for the candidate refresh address is monitored during the monitoring period. If an active command is processed for the candidate refresh address during the monitoring period, the scheduled refresh for that page is skipped. If no active command is processed for the candidate refresh address during the monitoring period, the scheduled refresh operation is performed.

20 Claims, 14 Drawing Sheets

MEMORY DEVICE AND METHOD OF REFRESHING IN A MEMORY DEVICE

CROSS-REFERENCE TO RELATED APPLICATION(S)

This application claims priority under 35 USC §119 to Korean Patent Application No. 10-2013-0013707, filed on Feb. 7, 2013 in the Korean Intellectual Property Office (KIPO), the contents of which are herein incorporated by reference in its entirety.

BACKGROUND

1. Technical Field

Example embodiments relate to a memory device, and more particularly to a method of refreshing a memory device.

2. Description of the Related Art

In general, as a density of a memory device increases, data retention time of the memory cell decreases.

Therefore, a refresh rate may be increased to increase the reliability of the memory device. However, when the refresh rate increases, power consumption of the memory device also increases.

SUMMARY

Some example embodiments are directed to provide a method of refreshing in a memory device.

Some example embodiments are directed to provide a memory device performing the method of refreshing.

A method of refreshing in a memory device having a plurality of pages according to some example embodiments, may comprise scheduling a page to be refreshed after a monitoring period, comprising generating a candidate refresh address of the page scheduled to be refreshed; monitoring whether an active command is processed for the candidate refresh address during the monitoring period; and skipping a refresh of the page scheduled to be refreshed when an active command has been processed for the candidate refresh address during the monitoring period.

Monitoring whether the active command is processed for the candidate refresh address during the monitoring period may include comparing the candidate refresh address with an active row address received together with the active command from an external device during the monitoring period.

A number of bits included in a row address of the memory device may be (p+q), and the row address of the memory device includes p high-order bits and q low-order bits, p and q being positive integers. Bit line sense and amplification operation may be performed concurrently and independently on pages corresponding to $2^p$ row addresses having identical q low-order bits and different p high-order bits from each other.

Pages having identical q low-order bits and different p high-order bits from each other may be located in different memory blocks of the memory device from each other.

Pages having identical q low-order bits and different p high-order bits from each other may be located in different memory banks of the memory device from each other.

Comparing the candidate refresh address with the active row address received together with the active command from the external device during the monitoring period may include comparing q low-order bits of the candidate refresh address with q low-order bits of the active row address received during the monitoring period and comparing p high-order bits of the candidate refresh address with p high-order bits of the active row address when q low-order bits of the candidate refresh address is identical with q low-order bits of the active row address.

Skipping the refresh of the page scheduled to be refreshed when an active command has been processed for the candidate refresh address during the monitoring period may comprise concurrently refreshing pages corresponding to row addresses that have q low-order bits identical with q low-order bits of the candidate refresh address and p high-order bits different from p high-order bits of an active row address received with the active command when the q low-order bits of the candidate refresh address are identical with q low-order bits of the active row address.

Scheduling multiple pages to be refreshed after a corresponding monitoring period, may comprise generating multiple candidate refresh addresses, each corresponding to a page scheduled to be refreshed, monitoring whether an active command is processed for any of the candidate refresh addresses during the corresponding monitoring period, and skipping a refresh of a page scheduled to be refreshed of the multiple pages scheduled to be refreshed when an active command has been processed for the corresponding candidate refresh address during the corresponding monitoring period.

Durations of the monitoring periods for the multiple pages scheduled to be refreshed may be the same.

A candidate refresh address may be generated at a rate of one per refresh interval.

Each monitoring period may correspond to m refresh intervals, wherein m is an integer equal to or greater than 2.

Durations of the monitoring periods may be different from each other.

At every mth refresh interval, m candidate refresh addresses may be generated corresponding to pages scheduled to be refreshed within m times the refresh interval.

The method may also comprise increasing the duration of the monitoring period when an average of a number of pages refreshed at every refresh period is relatively large; and decreasing the duration of the monitoring period when the average is relatively small.

A memory device may comprise a memory cell array including a plurality of pages; and a control unit configured to generate a candidate refresh address corresponding to a page scheduled to be refreshed after a monitoring period, configured to monitor whether an active command is processed for the candidate refresh address during the monitoring period, configured to refresh the page corresponding to the candidate refresh address when no active command is processed for the candidate refresh address during the monitoring period, and configured to skip a scheduled refresh of the page corresponding to the candidate refresh address when an active command has been processed for the candidate refresh address during the monitoring period.

The control unit may be configured to concurrently refresh pages corresponding to row addresses that have q low-order bits identical with q low-order bits of the candidate refresh address when q low-order bits of the candidate refresh address are different from q low-order bits of any active row address received together with an active command from an external device during the monitoring period, and configured to concurrently refresh pages corresponding to row addresses that have q low-order bits identical with q low-order bits of the candidate refresh address and p high-order bits different from p high-order bits of a received active row address when q low-order bits of the candidate refresh address are identical with q low-order bits of the received active row address received from the external device during the monitoring period, p and q being positive integers.

Pages having identical q low-order bits and p high-order bits that are different from each other may be located in different memory blocks of the memory cell array from each other.

A method of refreshing a memory device may comprise, in the memory device, generating refresh addresses at regular refresh intervals, the refresh addresses corresponding to memory locations scheduled to be refreshed; for each generated refresh address, after generating the corresponding refresh address, monitoring whether a separate command is processed to activate the memory location corresponding to the refresh address; and for each generated refresh address, if a separate command has been processed to activate the memory location corresponding to the refresh address prior to the scheduled refresh of the corresponding memory location, skipping the scheduled refresh of the corresponding memory location.

For each generated refresh address, after generating the corresponding refresh address, the monitoring of the processing of a separate command may be for a predetermined period after generating the corresponding refresh address. The predetermined period may be the same for each of the generated corresponding refresh addresses.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
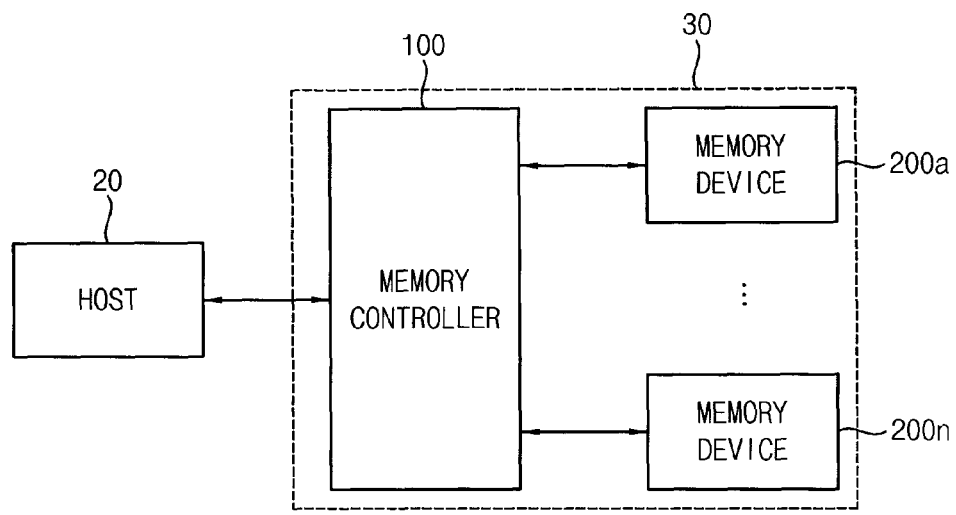
FIG. 1 is a block diagram illustrating an electronic system according to example embodiments.

Various example embodiments will be described more fully with reference to the accompanying drawings, in which some example embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through an interface protocol such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 with an interface protocol such as a Universal Serial Bus (USB), Multi-Media Card (MMC), Enhanced Small Disk Interface (ESDI), or Integrated Drive Electronics (IDE).

The memory controller 100 may control the overall operation of the memory system 30. The memory controller 100 may control the overall data exchange between the host 20 and the memory devices 200a~200n. For example, the memory controller 100 may write data in the memory devices 200a~200n or read data from the memory devices 200a~200n in response to request from the host 20.

In addition, the memory controller 100 may apply operational commands to the memory devices 200a~200n to control the memory devices 200a~200n.

In some embodiments, each of the memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be another type of a volatile memory device.

Figure 2:
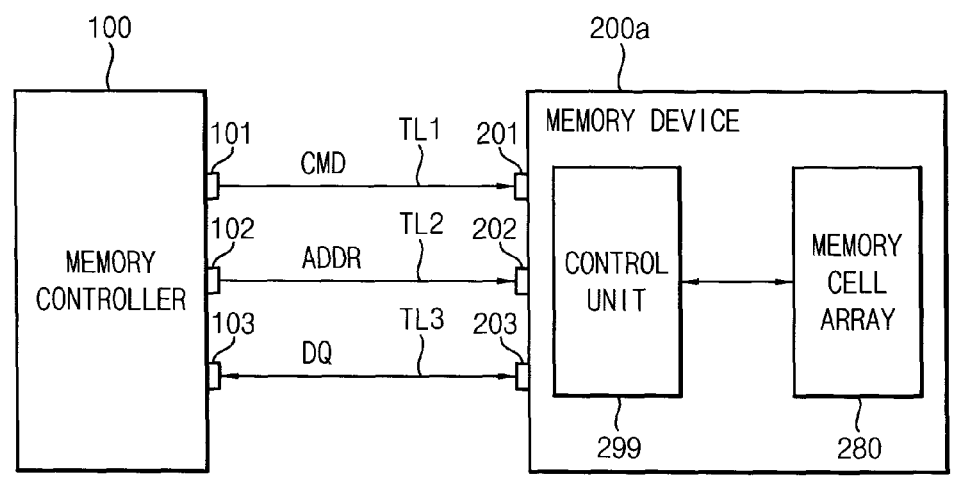
FIG. 2 is a block diagram illustrating an example of the memory system of FIG. 1 according to example embodiments.

FIG. 2 is a block diagram illustrating an example of the memory system 30 of FIG. 1 according to example embodiments.

In FIG. 2, only one memory device 200a connected to the memory controller 100 is illustrated for convenience.

Referring to FIG. 2, the memory system 30 includes the memory controller 100 and the memory device 200a. The memory controller 100 and the memory devices 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3.

The memory device 200a may include a control unit 299 and a memory cell array 280. The memory cell array 280 may include a plurality of pages. For example, one page may include one row of memory cells.

In a read mode, the memory controller 100 may provide an active command and an active row address to the control unit 299 through the command pins 101 and 201 and the address pins 102 and 202, respectively, and provide a read command and a column address to the control unit 299 through the command pins 101 and 201 and the address pins 102 and 202, respectively, after a row address-to-column address delay tRCD. The control unit 299 may activate a page corresponding to the active row address among the plurality of pages included in the memory cell array 280 in response to the active command, and provide read data stored in a memory cell corresponding to the column address of the activated page to the memory controller 100 through the data pins 103 and 203 in response to the read command.

In a write mode, the memory controller 100 may provide the active command and the active row address to the control unit 299 through the command pins 101 and 201 and the address pins 102 and 202, respectively, provide a write command and the column address to the control unit 299 through the command pins 101 and 201 and the address pins 102 and 202, respectively, after the row address-to-column address delay tRCD, and provide write data to the control unit 299 through the data pins 103 and 203 after a write latency tWL. The control unit 299 may activate a page corresponding to the active row address among the plurality of pages included in the memory cell array 280 in response to the active command, and write the write data in a memory cell corresponding to the column address of the activated page in response to the write command.

In a refresh mode, the memory controller 100 may provide a refresh command to the control unit 299 through the command pins 101 and 201, and the control unit 299 may refresh a plurality of pages included in the memory cell array 280 (e.g., consecutively) in response to the refresh command.

Figure 3:
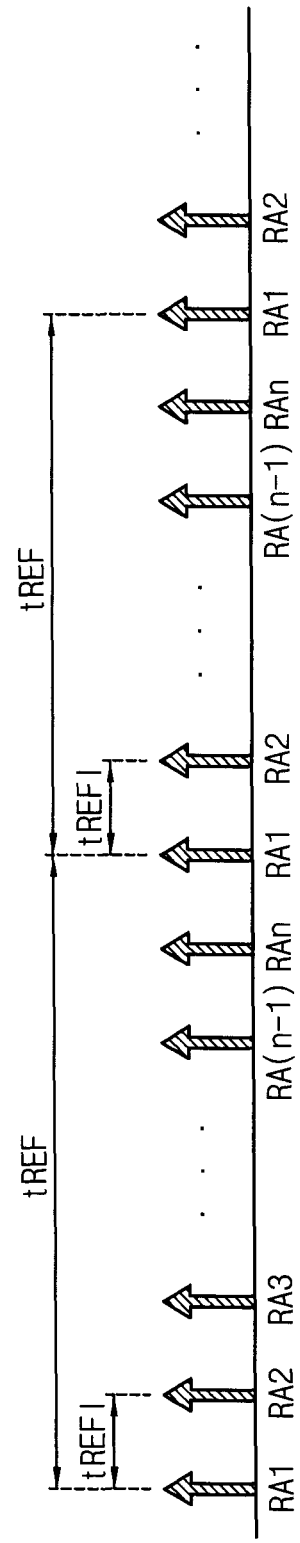
FIG. 3 is a diagram for describing a refresh operation of a conventional memory device.

FIG. 3 is a diagram for describing a refresh operation of a conventional memory device.

As illustrated in FIG. 3, when a memory cell array included in a conventional memory device has n pages, the conventional memory device generates a refresh row addresses consecutively at every refresh interval tREFI as row addresses RA1, RA2, RA3, . . . , RA(n−1), Ran, corresponding to the n pages included in the memory cell array, respectively (n being a positive integer). Therefore, the conventional memory device refreshes all of the n pages included in the memory cell array during a refresh period tREF.

For example, when the memory cell array includes $2^{13}$ pages, the refresh row address increases consecutively from <000000000000> to <1111111111111> during the refresh period tREF, incrementing every refresh interval tREFI.

The conventional memory device may perform a read operation or a write operation in response to a command from a memory controller during the refresh interval tREFI between the refresh operations.

The refresh operation may not be required for a page on which the read operation or the write operation has been performed recently.

As will be described below, the memory device 200a according to example embodiments selectively refreshes certain pages and may skip the refresh of other pages. Therefore, a refresh rate of the memory device 200a may decrease.

Figure 4:
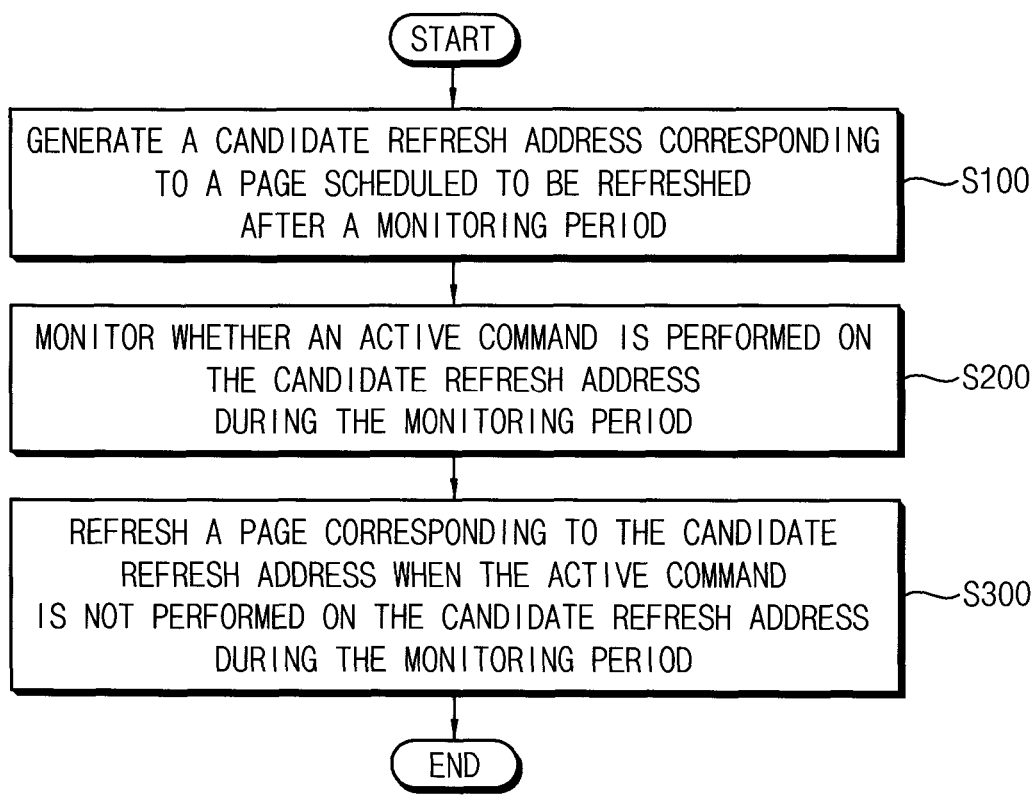
FIG. 4 is a flow chart illustrating a method of refreshing in a memory device according to example embodiments.

FIG. 4 is a flow chart illustrating a method of refreshing in a memory device according to example embodiments. The memory device 200a may have a plurality of pages.

Referring to FIG. 4, according to some example embodiments, the memory device 200a generates a candidate refresh address corresponding to a page scheduled to be refreshed after a monitoring period (step S100). A duration of the monitoring period may correspond to multiple times of the refresh interval tREFI. The memory device 200a monitors whether the active command received from the memory controller 100 is processed for a page corresponding to the candidate refresh address during the monitoring period (step S200). The memory device 200a does not refresh the page corresponding to the candidate refresh address when the active command is processed for the candidate refresh address at least once during the monitoring period, and refreshes the page corresponding to the candidate refresh address when the active command is not processed for the candidate refresh address during the monitoring period (step S300).

Figure 5:
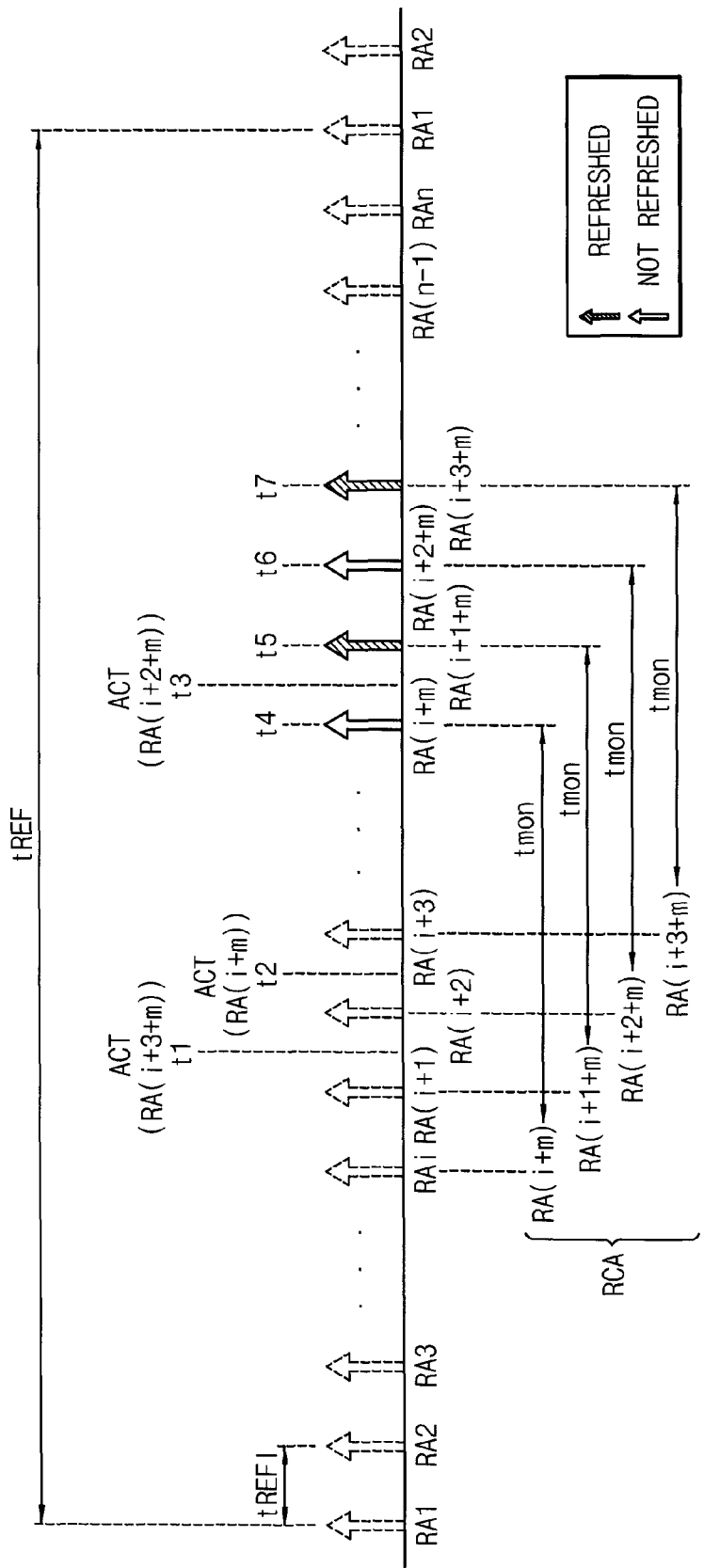
FIG. 5 is a diagram for describing an example of the method of refreshing in a memory device of FIG. 4.

FIG. 5 is a diagram for describing an example of the method of refreshing a memory device of FIG. 4.

Referring to FIG. 5, durations of the monitoring periods tmon for the plurality of the pages included in the memory device 200a may be the same, and the duration of the monitoring period tmon may correspond to m times of the refresh interval tREFI (m may be an integer equal to or greater than two). In this case, the control unit 299 may generate, at every refresh interval tREFI, a candidate refresh address RCA corresponding to a page scheduled to be refreshed after tmon (which equals m times the refresh interval tREFI in this example).

For example, as illustrated in FIG. 5, the control unit 299 may generate a candidate refresh address RCA as row address RA(i+m) while a page corresponding to a row address RAi is refreshed, generate a candidate refresh address RCA as row address RA(i+1+m) while a page corresponding to a row address RA(i+1) is refreshed, generate a candidate refresh address RCA as row address RA(i+2+m) while a page corresponding to a row address RA(i+2) is refreshed, and generate a candidate refresh address RCA as row address RA(i+3+m) while a page corresponding to a row address RA(i+3) is refreshed.

Therefore, the control unit 299 may maintain m candidate refresh addresses RCA at any one time, which correspond to pages scheduled to be refreshed within m times of the refresh interval tREFI after their generation. The control unit 299 may monitor, at every turn of the refresh interval tREFI, whether the active command ACT is received or processed for any of the m candidate refresh addresses RCA. For example, the control unit 299 may monitor whether the active command ACT is processed for any of the m candidate refresh addresses by comparing the active row address received together with an active command ACT from the memory controller 100 with each of the m the candidate refresh addresses RCA at every refresh interval tREFI.

In addition, the control unit 299 may determine, at every refresh interval tREFI, whether the active command ACT is received and/or processed at least once on a current candidate refresh address, which corresponds to a page scheduled to be refreshed at current refresh interval tREFI, among the m candidate refresh addresses RCA during previous m times of the refresh interval tREFI (that is, during the monitoring periods tmon). The control unit 299 may not refresh a page corresponding to the current candidate refresh address when the active command is processed at least once on the current candidate refresh address during previous m times of the refresh interval tREFI, and refresh the page corresponding to the current candidate refresh address when the active command is not processed for the current candidate refresh address during previous m times of the refresh interval tREFI.

For example, as illustrated in FIG. 5, the active command ACT may be processed for the row address RA(i+3+m) at a time t1, on the row address RA(i+m) at a time t2 and on the row address RA(i+2+m) at a time t3. In this case, at a time t4, the control unit 299 may skip the refresh of the page corresponding to the row address RA(i+m), which is the current candidate refresh address at the time t4, since the active command ACT had been processed for the row address RA(i+m) at the time t2 (i.e., the page with row address RA(i+m) had been activated), which is within the monitoring period tmon of the row address RA(i+m). At a time t5, the control unit 299 may refresh a page corresponding to the row address RA(i+1+m), which is the current candidate refresh address at the time t5, since the active command ACT was not processed for the row address RA(i+1+m) during the monitoring period tmon of the row address RA(i+1+m). At a time t6, the control unit 299 skip the refresh of the page corresponding to the row address RA(i+2+m), which is the current candidate refresh address at the time t6, since the active command ACT had been processed for the row address RA(i+2+m) at time t3, which is within the monitoring period tmon of the row address RA(i+2+m). At a time t7, the control unit 299 may refresh a page corresponding to the row address RA(i+3+m), which is the current candidate refresh address at the time t7, since the active command ACT was not processed for the row address RA(i+3+m) during the monitoring period tmon of the row address RA(i+3+m).

Figure 6:
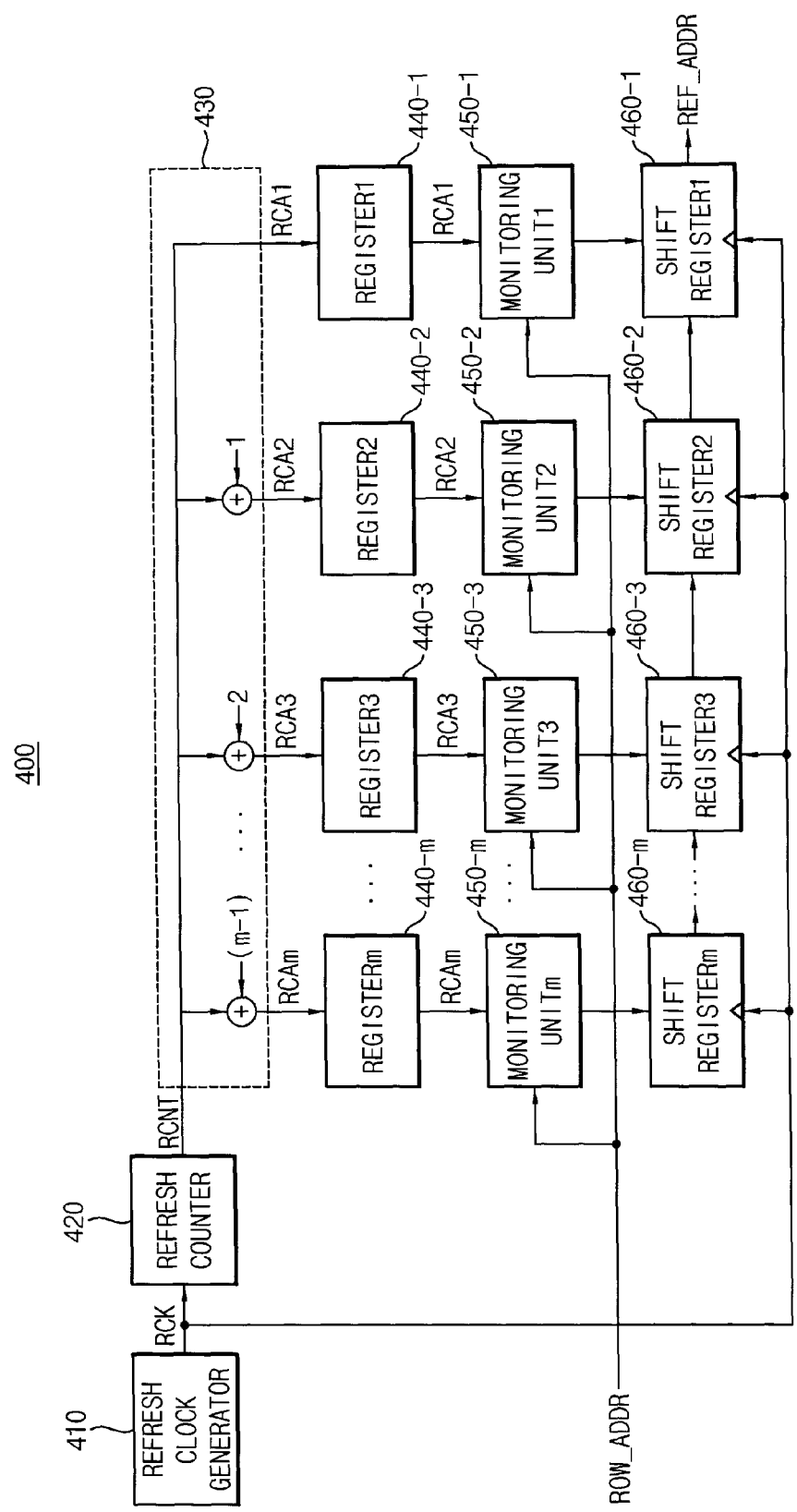
FIG. 6 is a block diagram illustrating a refresh address generator for performing the method of refreshing of FIG. 5.

FIG. 6 is a block diagram illustrating a refresh address generator for performing the method of refreshing of FIG. 5.

The control unit 299 may include a refresh address generator 400 of FIG. 6 for performing the method of refreshing described with reference to FIG. 5.

Referring to FIG. 6, the refresh address generator 400 may include a refresh clock generator 410, a refresh counter 420, a candidate refresh address generator 430, first through m-th registers 440-1, 440-2, 440-3, ..., 440-m, first through m-th monitoring units 450-1, 450-2, 450-3, ..., 450-m, and first through m-th shift registers 460-1, 460-2, 460-3, ..., 460-m.

The refresh clock generator 410 may generate a refresh clock signal RCK having a cycle corresponding to the refresh interval tREFI.

The refresh counter 420 may generate a refresh count value RCNT in response to the refresh clock signal RCK by incrementing the refresh count value RCNT by one every cycle of the refresh clock signal RCK.

The candidate refresh address generator 430 may generate first through m-th candidate refresh addresses RCA1, RCA2, RCA3, ..., RCAm by adding zero through (m−1) to the refresh count value RCNT, respectively. The first through m-th candidate refresh addresses RCA1, RCA2, RCA3, ..., RCAm may represent row addresses corresponding to pages scheduled to be refreshed after one time of the refresh interval tREFI through after m times of the refresh interval tREFI, respectively.

The first through m-th registers 440-1, 440-2, 440-3, ..., 440-m may store the first through m-th candidate refresh addresses RCA1, RCA2, RCA3, ..., RCAm, respectively.

Therefore, the refresh address generator 400 may newly generate the m-th candidate refresh address RCAm corresponding to a page scheduled to be refreshed after m times of the refresh interval tREFI and store the m-th candidate refresh address RCAm in the m-th register 440-m at every turn of the refresh interval tREFI. The first through (m−1)-th candidate refresh addresses RCA1, RCA2, RCA3, ..., RCA(m−1) stored in the first through (m−1)-th registers 440-1, 440-2, 440-3, ..., 440-(m−1) at current refresh interval tREFI may be the same as the second through m-th candidate refresh addresses RCA2, RCA3, ..., RCAm stored in the second through m-th registers 440-2, 440-3, ..., 440-m at previous refresh interval tREFI.

The first through m-th monitoring units 450-1, 450-2, 450-3, ..., 450-m may receive the first through m-th candidate refresh addresses RCA1, RCA2, RCA3, ..., RCAm from the first through m-th registers 440-1, 440-2, 440-3, ..., 440-m, respectively, and receive the active row address ROW_ADDR provided from the memory controller 100 together with the active command ACT. For example, the first through m-th monitoring units 450-1, 450-2, 450-3, ..., 450-m may receive the active row address ROW_ADDR from a row address buffer included in the control unit 299 that temporary stores the active row address ROW_ADDR provided from the memory controller 100. The first through m-th monitoring units 450-1, 450-2, 450-3, ..., 450-m may compare the active row address ROW_ADDR with the respective one of the first through m-th candidate refresh addresses RCA1, RCA2, RCA3, ..., RCAm, and output a refresh determination bit, which indicates that the active row address ROW_ADDR is identical with the respective one of the first through m-th candidate refresh addresses RCA1, RCA2, RCA3, ..., RCAm, together with the respective one of the first through m-th candidate refresh addresses RCA1, RCA2, RCA3, ..., RCAm.

The first through m-th shift registers 460-1, 460-2, 460-3, ..., 460-m may be connected in series. The first through m-th shift registers 460-1, 460-2, 460-3, . . . , 460-m may store the refresh determination bit and the first through m-th candidate refresh addresses RCA1, RCA2, RCA3, . . . , RCAm provided from the first through m-th monitoring units 450-1, 450-2, 450-3, . . . , 450-m, respectively. The second through m-th shift registers 460-2, 460-3, . . . , 460-m may transfer the refresh determination bit and the second through m-th candidate refresh addresses RCA2, RCA3, . . . , RCAm to the first through (m−1)-th shift registers 460-1, 460-2, 460-3, . . . , 460-(m−1), respectively, in response to the refresh clock signal RCK. The first shift register 460-1, which is connected in the last stage, may output the first candidate refresh address RCA1 together with the refresh determination bit as a refresh row address REF_ADDR in response to the refresh clock signal RCK.

As described above, the refresh address generate 400 may generate the candidate refresh address RCA corresponding to a page scheduled to be refreshed after m times of the refresh interval tREFI, monitor whether the active command ACT is processed for the candidate refresh address RCA during m times of the refresh interval tREFI, and generate the refresh row address REF_ADDR including the candidate refresh address RCA and the refresh determination bit representing the monitoring result. The control unit 299 may decode the refresh row address REF_ADDR received from the refresh address generate 400 and selectively refresh a page corresponding to the candidate refresh address RCA based on a logic level of the refresh determination bit.

Figure 7:
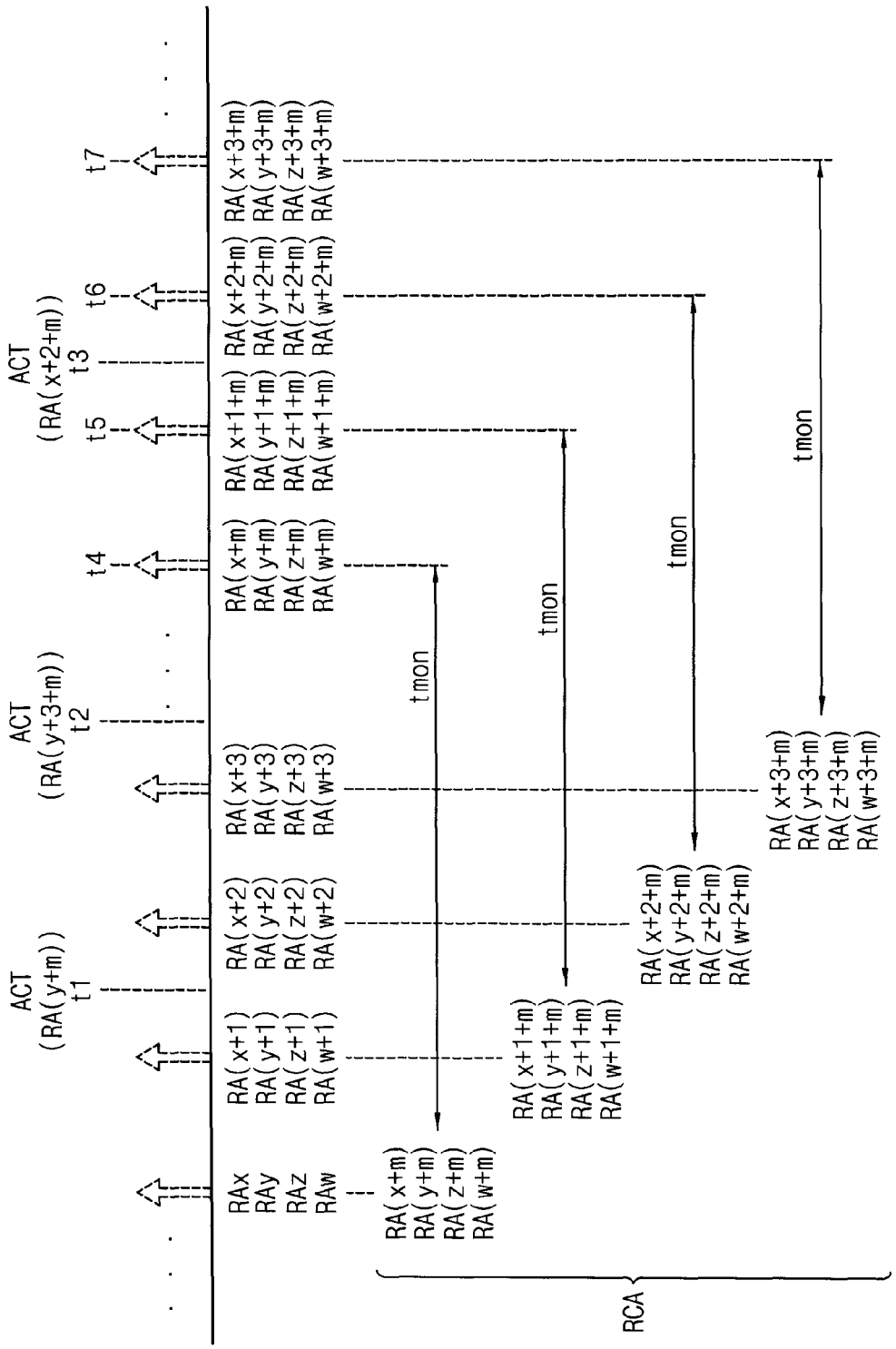
FIG. 7 is a diagram for describing another example of the method of refreshing in a memory device of FIG. 4.

FIG. 7 is a diagram for describing another example of the method of refreshing in a memory device of FIG. 4.

Referring to FIG. 7, the memory device 200a may refresh multiple pages concurrently. For example, when a number of bits included in a row address of the memory device 200a is (p+q), and the row address of the memory device 200a includes p high-order bits and q low-order bits, the memory device 200a may concurrently refresh multiple pages corresponding to $2^p$ row addresses having identical q low-order bits and different p high-order bits from each other. Here, p and q are positive integers. For concurrently refreshing the multiple pages corresponding to $2^p$ row addresses having identical q low-order bits and different p high-order bits from each other, bit line sense and amplification operation may be required to be performed concurrently and independently on the multiple pages corresponding to $2^p$ row addresses having identical q low-order bits and different p high-order bits from each other. Therefore, in some example embodiments, the multiple pages corresponding to $2^p$ row addresses having identical q low-order bits and different p high-order bits from each other may be included in different memory blocks of the memory cell array 280 from each other. In other example embodiments, the multiple pages corresponding to $2^p$ row addresses having identical q low-order bits and different p high-order bits from each other may be included in different memory banks of the memory cell array 280 from each other.

In FIG. 7, the row address of the memory device 200a includes two high-order bits as an example. That is, p represents two in FIG. 7. However, example embodiments are not limited thereto, and p may be any positive integer.

In FIG. 7, row addresses RAx, RAy, RAz, RAw have identical q low-order bits and different p high-order bits from each other. Therefore, the control unit 299 may refresh pages corresponding to the row addresses RAx, RAy, RAz, RAw concurrently.

Referring to FIG. 7, durations of the monitoring periods tmon for the plurality of the pages included in the memory device 200a may be the same, and the duration of the monitoring period tmon may correspond to m times of the refresh interval tREFI. Here, m represents an integer equal to or greater than two. In this case, the control unit 299 may generate, at every turn of the refresh interval tREFI, the candidate refresh address RCA corresponding to a page scheduled to be refreshed after m times of the refresh interval tREFI.

For example, as illustrated in FIG. 7, the control unit 299 may generate the candidate refresh address RCA as a row address having q low-order bits identical with q low-order bits of row addresses RA(x+m), RA(y+m), RA(z+m), RA(w+m) while pages corresponding to row addresses RAx, RAy, RAz, RAw are refreshed, generate the candidate refresh address RCA as a row address having q low-order bits identical with q low-order bits of row addresses RA(x+1+m), RA(y+1+m), RA(z+1+m), RA(w+1+m) while pages corresponding to row addresses RA(x+1), RA(y+1), RA(z+1), RA(w+1) are refreshed, generate the candidate refresh address RCA as a row address having q low-order bits identical with q low-order bits of row addresses RA(x+2+m), RA(y+2+m), RA(z+2+m), RA(w+2+m) while pages corresponding to row addresses RA(x+2), RA(y+2), RA(z+2), RA(w+2) are refreshed, and generate the candidate refresh address RCA as a row address having q low-order bits identical with q low-order bits of row addresses RA(x+3+m), RA(y+3+m), RA(z+3+m), RA(w+3+m) while pages corresponding to row addresses RA(x+3), RA(y+3), RA(z+3), RA(w+3) are refreshed.

Therefore, the control unit 299 may maintain m candidate refresh addresses RCA, which correspond to pages scheduled to be refreshed within m times of the refresh interval tREFI after their respective generation. The control unit 299 may monitor, at every turn of the refresh interval tREFI, whether the active command ACT is processed for each of the m candidate refresh addresses RCA corresponding to pages scheduled to be refreshed within m times of the refresh interval tREFI. For example, the control unit 299 may monitor whether the active command ACT is processed for any of the m candidate refresh addresses by comparing the active row address ROW_ADDR received together with the active command ACT from the memory controller 100 with each of the m the candidate refresh addresses RCA at every turn of the refresh interval tREFI.

When q low-order bits of the candidate refresh address RCA is different from q low-order bits of the active row address ROW_ADDR, the control unit 299 may decide that the active command ACT is not processed for the candidate refresh address RCA. When q low-order bits of the candidate refresh address RCA is identical with q low-order bits of the active row address ROW_ADDR, the control unit 299 may determine on which one of $2^p$ row addresses having q low-order bits identical with q low-order bits of the candidate refresh address RCA the active command ACT is processed by comparing p high-order bits of the candidate refresh address RCA with p high-order bits of the active row address ROW_ADDR.

In addition, the control unit 299 may determine, at every refresh interval tREFI, whether the active command ACT is processed at least once on a current candidate refresh address, which corresponds to a page scheduled to be refreshed at current refresh interval tREFI, among the m candidate refresh addresses RCA during previous m times of the refresh interval tREFI (that is, during the monitoring periods tmon of the current candidate refresh address). The control unit 299 may concurrently refresh pages corresponding to $2^p$ row addresses that have q low-order bits identical with q low-order bits of the candidate refresh address RCA when q low-order bits of the candidate refresh address RCA is different from q low-order bits of the active row address ROW_ADDR received from the memory controller 100 during the monitoring period tmon of the current candidate refresh address. The control unit 299 may concurrently refresh at least some of the pages corresponding to row addresses that have q low-order bits identical with the q low-order bits of the candidate refresh address RCA and p high-order bits different from the p high-order bits of the active row address ROW_ADDR when the q low-order bits of the candidate refresh address RCA are identical with the q low-order bits of the active row address ROW_ADDR received from the memory controller 100 during the monitoring period tmon of the current candidate refresh address.

For example, as illustrated in FIG. 7, the active command ACT may be processed for the row address RA(y+m) at a time t1, on the row address RA(y+3+m) at a time t2 and on the row address RA(x+2+m) at a time t3. In this case, at a time t4, the control unit 299 may refresh pages corresponding to row addresses RA(x+m), RA(z+m), RA(w+m) among row addresses RA(x+m), RA(y+m), RA(z+m), RA(w+m) having q low-order bits identical with q low-order bits of the current candidate refresh address at the time t4, since the active command ACT was processed for the row address RA(y+m) at the time t1, which within the monitoring period tmon of the row addresses RA(x+m), RA(y+m), RA(z+m), RA(w+m). At a time t5, the control unit 299 may refresh pages corresponding to all of row addresses RA(x+1+m), RA(y+1+m), RA(z+1+m), RA(w+1+m) having q low-order bits identical with q low-order bits of the current candidate refresh address at the time t5, since the active command ACT was not processed for the row addresses RA(x+1+m), RA(y+1+m), RA(z+1+m), RA(w+1+m) during the monitoring period tmon of the row addresses RA(x+1+m), RA(y+1+m), RA(z+1+m), RA(w+1+m). At a time t6, the control unit 299 may refresh pages corresponding to row addresses RA(y+2+m), RA(z+2+m), RA(w+2+m) among row addresses RA(x+2+m), RA(y+2+m), RA(z+2+m), RA(w+2+m) having q low-order bits identical with q low-order bits of the current candidate refresh address at the time t6, since the active command ACT was processed for the row address RA(x+2+m) at the time t3, which is within the monitoring period tmon of the row addresses RA(x+2+m), RA(y+2+m), RA(z+2+m), RA(w+2+m). At a time t7, the control unit 299 may refresh pages corresponding to row addresses RA(x+3+m), RA(z+3+m), RA(w+3+m) among row addresses RA(x+3+m), RA(y+3+m), RA(z+3+m), RA(w+3+m) having q low-order bits identical with q low-order bits of the current candidate refresh address at the time t7, since the active command ACT was processed for the row address RA(y+3+m) at the time t2, which within the monitoring period tmon of the row addresses RA(x+3+m), RA(y+3+m), RA(z+3+m), RA(w+3+m).

Figure 8:
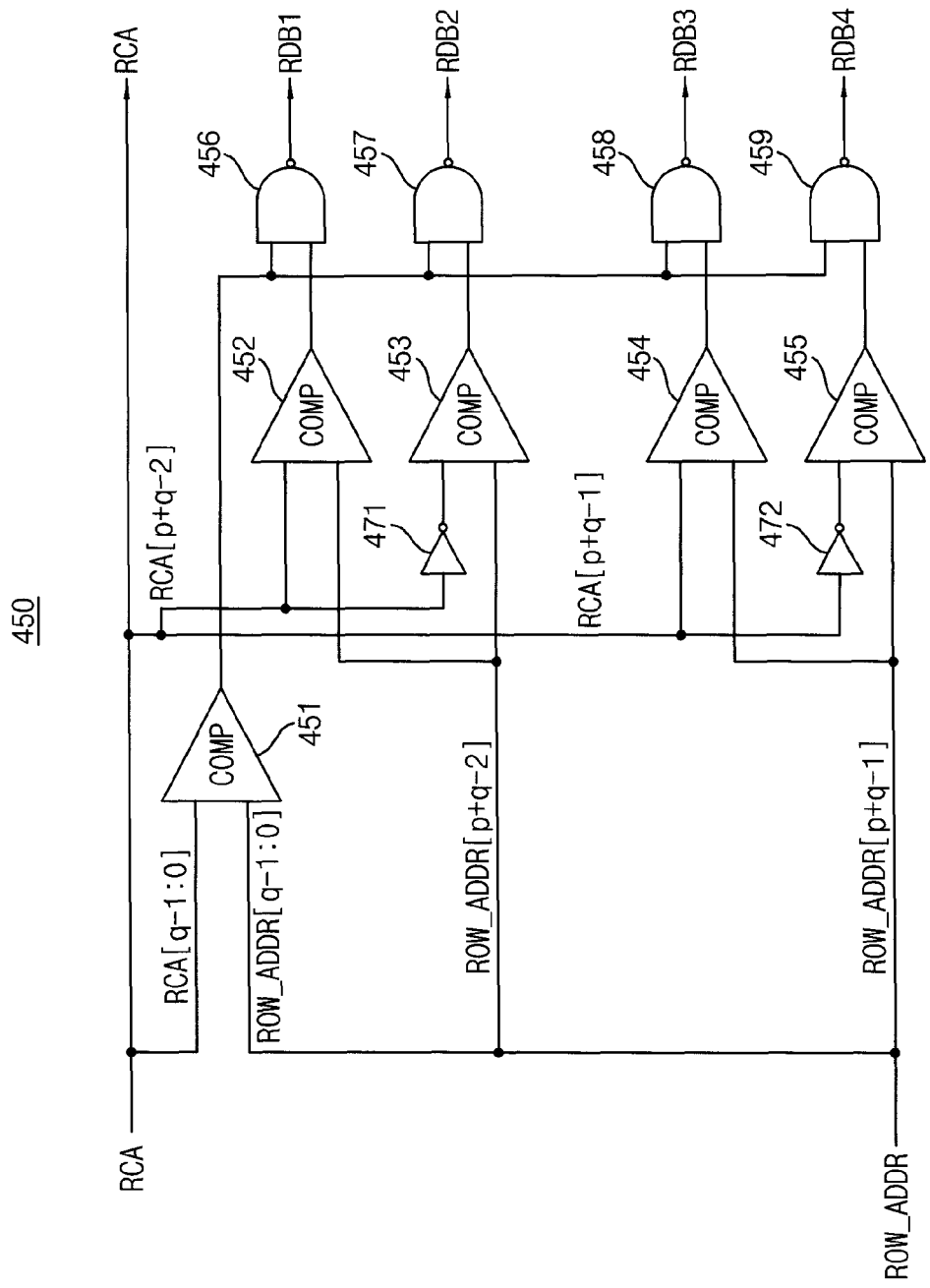
FIG. 8 is a block diagram illustrating an example of a monitoring unit included in the refresh address generator of FIG. 6 for performing the method of refreshing of FIG. 7.

FIG. 8 is a block diagram illustrating an example of a monitoring unit included in the refresh address generator of FIG. 6 for performing the method of refreshing of FIG. 7.

The control unit 299 may include the refresh address generator 400 of FIG. 6 for performing the method of refreshing described with reference to FIG. 7. In this case, each of the first through m-th monitoring units 450-1, 450-2, 450-3, ..., 450-m included in the refresh address generator 400 may be implemented with a monitoring unit 450 of FIG. 8.

In FIG. 8, the row address of the memory device 200a includes two high-order bits as an example. p is two in the example of FIG. 8. However, example embodiments are not limited thereto, and p may be any positive integer.

Referring to FIG. 8, the monitoring unit 450 may include first through fifth comparators 451, 452, 453, 454, 455, first through fourth AND gates 456, 457, 458, 459, a first inverter 471 and a second inverter 472.

The first comparator 451 may compare q low-order bits of the candidate refresh address RCA with q low-order bits of the active row address ROW_ADDR. The second comparator 452 may compare a second most significant bit of the candidate refresh address RCA with a second most significant bit of the active row address ROW_ADDR. The third comparator 453 may compare an inverted version of the second most significant bit of the candidate refresh address RCA, which is received from the first inverter 471, with the second most significant bit of the active row address ROW_ADDR. The fourth comparator 454 may compare a most significant bit of the candidate refresh address RCA with a most significant bit of the active row address ROW_ADDR. The fifth comparator 455 may compare an inverted version of the most significant bit of the candidate refresh address RCA, which is received from the second inverter 472, with the most significant bit of the active row address ROW_ADDR. The first through fifth comparators 451, 452, 453, 454, 455 may generate an output signal having a logic high level when two input signals are the same, and generate an output signal having a logic low level when two input signals are different from each other.

When q low-order bits of the candidate refresh address RCA is different from q low-order bits of the active row address ROW_ADDR, the first comparator 451 may generate the output signal having a logic low level. Therefore, the first through fourth AND gates 456, 457, 458, 459 may output first through fourth refresh determination bits RDB1, RDB2, RDB3, RDB4 having a logic high level, respectively.

When q low-order bits of the candidate refresh address RCA is identical with q low-order bits of the active row address ROW_ADDR, the first refresh determination bit RDB1 generated from the first AND gate 456 and the second refresh determination bit RDB2 generated from the second AND gate 457 may have different logic levels from each other, and the third refresh determination bit RDB3 generated from the third AND gate 458 and the fourth refresh determination bit RDB4 generated from the fourth AND gate 459 may have different logic levels from each other. Therefore, the first through fourth refresh determination bits RDB1, RDB2, RDB3, RDB4 may represent which one of four row addresses having q low-order bits identical with q low-order bits of the candidate refresh address RCA is identical with the active row address ROW_ADDR.

As illustrated in FIG. 8, the monitoring unit 450 may output the first through fourth refresh determination bits RDB1, RDB2, RDB3, RDB4 together with the candidate refresh address RCA. Therefore, the control unit 299 may determine whether q low-order bits of the candidate refresh address RCA is identical with q low-order bits of the active row address ROW_ADDR based on the first through fourth refresh determination bits RDB1, RDB2, RDB3, RDB4. Furthermore, when q low-order bits of the candidate refresh address RCA is identical with q low-order bits of the active row address ROW_ADDR, the control unit 299 may determine which one of $2^p$ row addresses having q low-order bits identical with q low-order bits of the candidate refresh address RCA is identical with the active row address ROW_ADDR based on the first through fourth refresh determination bits RDB1, RDB2, RDB3, RDB4. Therefore, the control unit 299 may decode the refresh row address REF_ADDR, which is received from the refresh address generator 400 and includes the candidate refresh address RCA and the first through fourth refresh determination bits RDB1, RDB2, RDB3, RDB4, and refresh pages corresponding to row addresses that are not identical with the active row address ROW_ADDR among $2^p$ row addresses having q low-order bits identical with q low-order bits of the candidate refresh address RCA.

Figure 9:
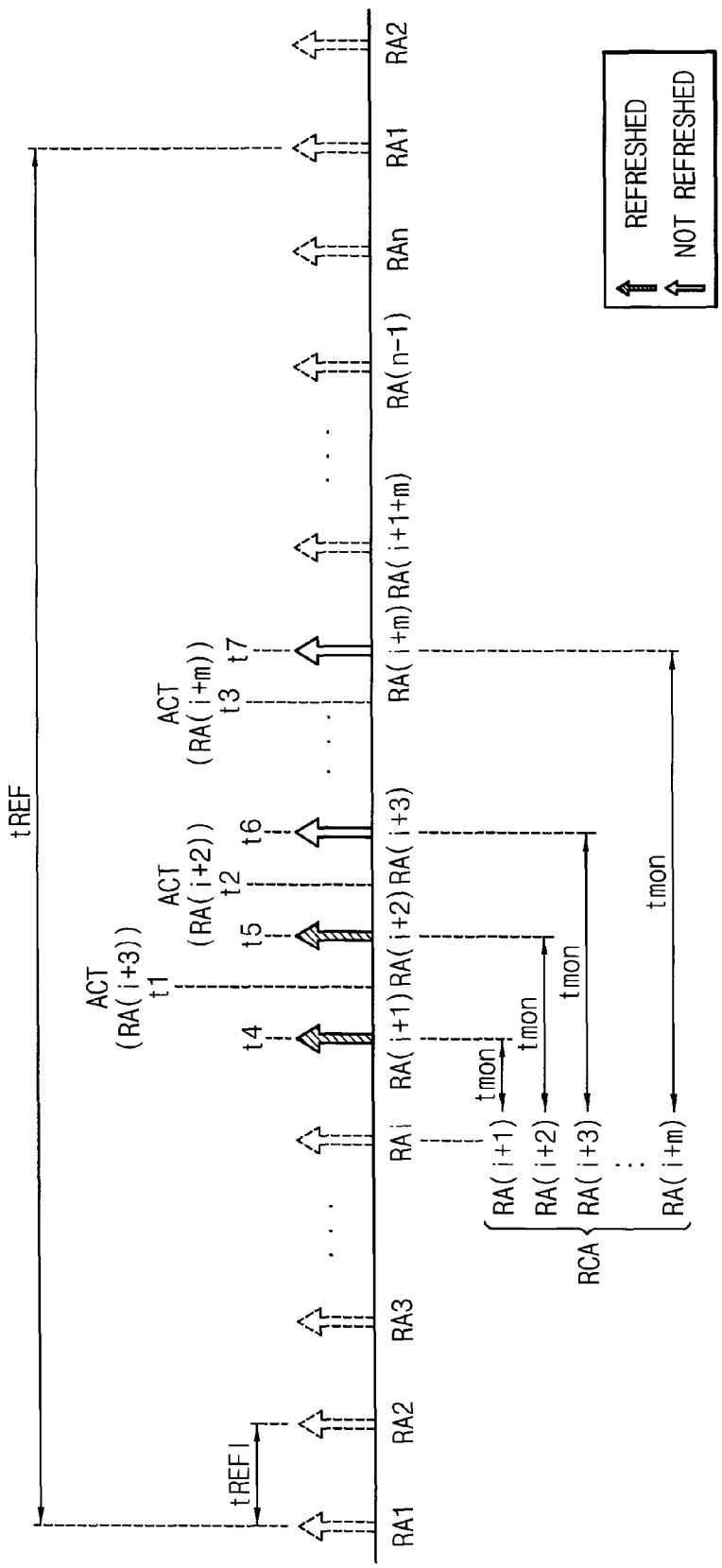
FIG. 9 is a diagram for describing still another example of the method of refreshing in a memory device of FIG. 4.

FIG. 9 is a diagram for describing still another example of the method of refreshing in a memory device of FIG. 4.

Referring to FIG. 9, durations of the monitoring periods tmon for the plurality of the pages included in the memory device 200a may be different from each other, and the duration of the monitoring period tmon for each of the plurality of the pages included in the memory device 200a may correspond to one of one through m refresh intervals tREFI. In this case, the control unit 299 may concurrently generate, at every m turns of the refresh interval tREFI, m candidate refresh addresses RCA corresponding to pages scheduled to be refreshed within m times of the refresh interval tREFI.

For example, as illustrated in FIG. 9, the control unit 299 may concurrently generate m candidate refresh addresses RCA as row addresses RA(i+1), RA(i+2), RA(i+3), . . . , RA(i+m), which correspond to pages scheduled to be refreshed within m times of the refresh interval tREFI, while a page corresponding to a row address RAi is refreshed.

Therefore, a duration of the monitoring period tmon of the row address RA(i+1) may correspond to one refresh interval tREFI, a duration of the monitoring period tmon of the row address RA(i+2) may correspond to two times of the refresh interval tREFI, a duration of the monitoring period tmon of the row address RA(i+3) may correspond to three times of the refresh interval tREFI, and a duration of the monitoring period tmon of the row address RA(i+m) may correspond to m times of the refresh interval tREFI.

The control unit 299 may monitor, at every turn of the refresh interval tREFI, whether the active command ACT is processed for at least one of the m candidate refresh addresses RCA, the monitoring period tmon of which is not yet passed. For example, the control unit 299 may monitor whether the active command ACT is processed for the at least one of the m candidate refresh addresses RCA, the monitoring period tmon of which is not yet passed, by comparing the active row address ROW_ADDR received together with the active command ACT from the memory controller 100 with the at least one of the m the candidate refresh addresses RCA, the monitoring period tmon of which is not yet passed, at every turn of the refresh interval tREFI.

In addition, the control unit 299 may determine, at every refresh interval tREFI, whether the active command ACT is processed at least once on a current candidate refresh address, which corresponds to a page scheduled to be refreshed at current refresh interval tREFI, among the m candidate refresh addresses RCA during the monitoring period tmon of the current candidate refresh address. The control unit 299 may not refresh a page corresponding to the current candidate refresh address when the active command is processed at least once on the current candidate refresh address during the monitoring period tmon of the current candidate refresh address, and refresh the page corresponding to the current candidate refresh address when the active command is not processed for the current candidate refresh address during the monitoring period tmon of the current candidate refresh address.

For example, as illustrated in FIG. 9, the active command ACT may be processed for the row address RA(i+3) at a time t1, on the row address RA(i+2) at a time t2 and on the row address RA(i+m) at a time t3. In this case, at a time t4, the control unit 299 may refresh the page corresponding to the row address RA(i+1), which is the current candidate refresh address at the time t4, since the active command ACT is not processed for the row address RA(i+1) during the monitoring period tmon of the row address RA(i+1). At a time t5, the control unit 299 may refresh the page corresponding to the row address RA(i+2), which is the current candidate refresh address at the time t5, since the active command ACT is not processed for the row address RA(i+2) during the monitoring period tmon of the row address RA(i+2). At a time t6, the control unit 299 skip the refresh of the page corresponding to the row address RA(i+3), which is the current candidate refresh address at the time t6, since the active command ACT is processed for the row address RA(i+3) at the time t1, which is within the monitoring period tmon of the row address RA(i+3). At a time t7, the control unit 299 may skip the refresh of the page corresponding to the row address RA(i+m), which is the current candidate refresh address at the time t7, since the active command ACT is processed for the row address RA(i+m) at the time t3, which is within the monitoring period tmon of the row address RA(i+m).

Figure 10:
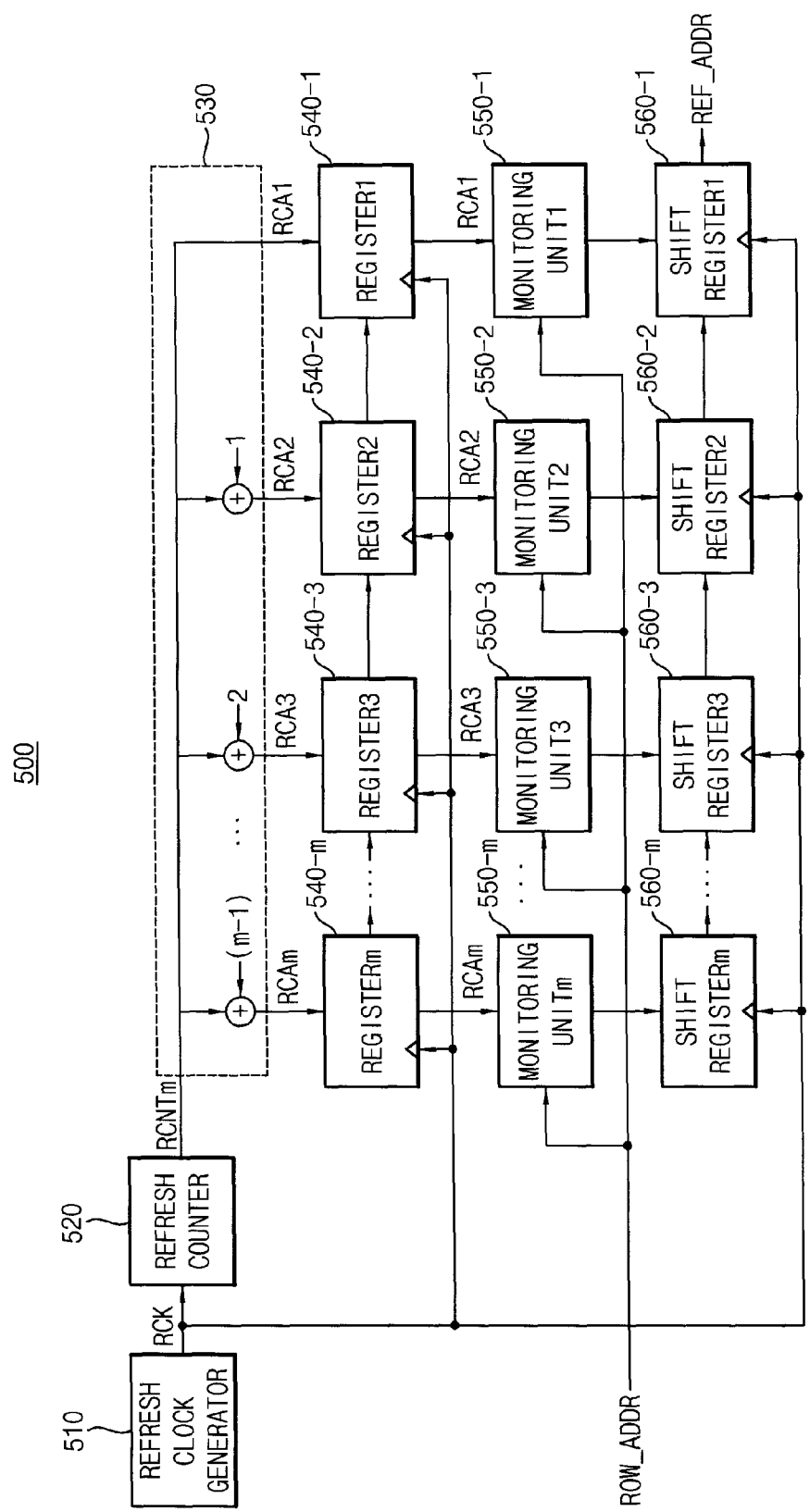
FIG. 10 is a block diagram illustrating a refresh address generator for performing the method of refreshing of FIG. 9.

FIG. 10 is a block diagram illustrating a refresh address generator for performing the method of refreshing of FIG. 9.

The control unit 299 may include a refresh address generator 500 of FIG. 10 for performing the method of refreshing described with reference to FIG. 9.

Referring to FIG. 10, the refresh address generator 500 may include a refresh clock generator 510, a refresh counter 520, a candidate refresh address generator 530, first through m-th registers 540-1, 540-2, 540-3, . . . , 540-m, first through m-th monitoring units 550-1, 550-2, 550-3, . . . , 550-m, and first through m-th shift registers 560-1, 560-2, 560-3, . . . , 560-m.

The refresh clock generator 510 may generate a refresh clock signal RCK having a cycle corresponding to the refresh interval tREFI.

The refresh counter 520 may generate a refresh count value RCNTm in response to the refresh clock signal RCK by incrementing the refresh count value RCNTm by m every m cycles of the refresh clock signal RCK.

When the candidate refresh address generator 530 receives the refresh count value RCNTm from the refresh counter 520, the candidate refresh address generator 530 may concurrently generate first through m-th candidate refresh addresses RCA1, RCA2, RCA3, . . . , RCAm by adding zero through (m−1) to the refresh count value RCNTm, respectively. The first through m-th candidate refresh addresses RCA1, RCA2, RCA3, . . . , RCAm may represent row addresses corresponding to pages scheduled to be refreshed after one time of the refresh interval tREFI through after m times of the refresh interval tREFI, respectively.

The first through m-th registers 540-1, 540-2, 540-3, . . . , 540-m may store the first through m-th candidate refresh addresses RCA1, RCA2, RCA3, . . . , RCAm, respectively, provided from the candidate refresh address generator 530 at every m turns of the refresh interval tREFI. The second through m-th registers 540-2, 540-3, . . . , 540-m may transfer the second through m-th candidate refresh addresses RCA2, RCA3, . . . , RCAm to the first through (m−1)-th registers 540-1, 540-2, 540-3, . . . , 540-(m−1), respectively, in response to the refresh clock signal RCK.

The first through m-th monitoring units 550-1, 550-2, 550-3, . . . , 550-m may receive the first through m-th candidate refresh addresses RCA1, RCA2, RCA3, . . . , RCAm from the first through m-th registers 540-1, 540-2, 540-3, . . . , 540-m, respectively, and receive the active row address ROW_ADDR provided from the memory controller 100 together with the active command ACT. For example, the first through m-th monitoring units 550-1, 550-2, 550-3, . . . , 550-m may receive the active row address ROW_ADDR from a row address buffer included in the control unit 299 that temporary stores the active row address ROW_ADDR provided from the memory controller 100. The first through m-th monitoring units 550-1, 550-2, 550-3, ..., 550-m may compare the active row address ROW_ADDR with the first through m-th candidate refresh addresses RCA1, RCA2, RCA3, ..., RCAm, respectively, and output a refresh determination bit, which indicates that the active row address ROW_ADDR is identical with the first through m-th candidate refresh addresses RCA1, RCA2, RCA3, ..., RCAm, respectively, together with the first through m-th candidate refresh addresses RCA1, RCA2, RCA3, ..., RCAm, respectively.

The first through m-th shift registers 560-1, 560-2, 560-3, ..., 560-m may be connected in series. The first through m-th shift registers 560-1, 560-2, 560-3, ..., 560-m may store the refresh determination bit and the first through m-th candidate refresh addresses RCA1, RCA2, RCA3, ..., RCAm provided from the first through m-th monitoring units 550-1, 550-2, 550-3, ..., 550-m, respectively. The second through m-th shift registers 560-2, 560-3, ..., 560-m may transfer the refresh determination bit and the second through m-th candidate refresh addresses RCA2, RCA3, ..., RCAm to the first through (m−1)-th shift registers 560-1, 560-2, 560-3, ..., 560-(m−1), respectively, in response to the refresh clock signal RCK. The first shift register 560-1, which is connected in the last stage, may output the first candidate refresh address RCA1 together with the refresh determination bit as a refresh row address REF_ADDR in response to the refresh clock signal RCK.

The control unit 299 may decode the refresh row address REF_ADDR received from the refresh address generate 500 and selectively refresh a page corresponding to the candidate refresh address RCA based on a logic level of the refresh determination bit.

Figure 11:
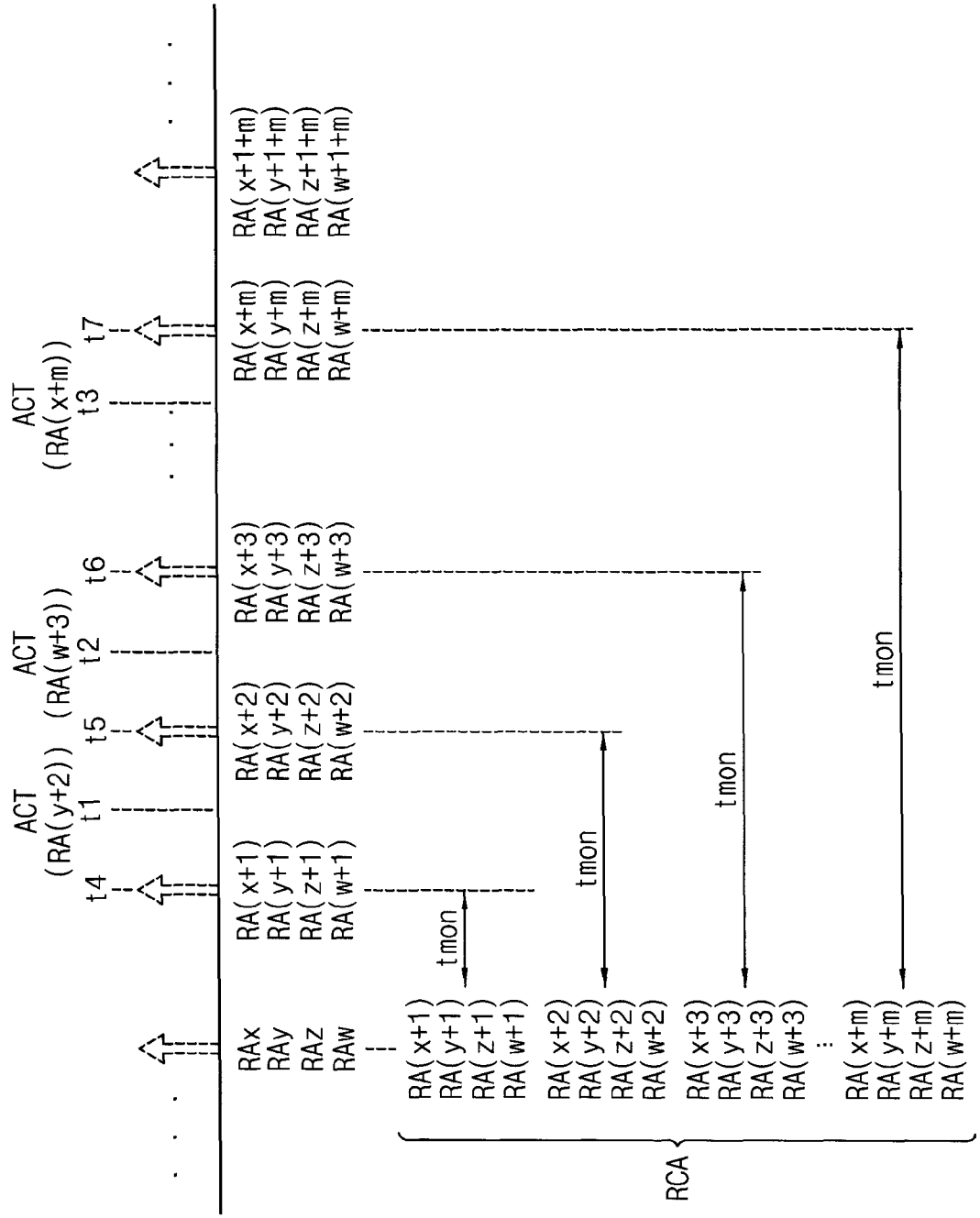
FIG. 11 is a diagram for describing still another example of the method of refreshing in a memory device of FIG. 4.

FIG. 11 is a diagram for describing still another example of the method of refreshing in a memory device of FIG. 4.

Referring to FIG. 11, the memory device 200a may refresh multiple pages concurrently. For example, when a number of bits included in a row address of the memory device 200a is (p+q), and the row address of the memory device 200a includes p high-order bits and q low-order bits, the memory device 200a may concurrently refresh multiple pages corresponding to $2^p$ row addresses having identical q low-order bits and different p high-order bits from each other. Here, p and q are positive integers. For concurrently refreshing the multiple pages corresponding to $2^p$ row addresses having identical q low-order bits and different p high-order bits from each other, bit line sense and amplification operation may be required to be performed concurrently and independently on the multiple pages corresponding to $2^p$ row addresses having identical q low-order bits and different p high-order bits from each other. Therefore, in some example embodiments, the multiple pages corresponding to $2^p$ row addresses having identical q low-order bits and different p high-order bits from each other may be included in different memory blocks of the memory cell array 280 from each other. In other example embodiments, the multiple pages corresponding to $2^p$ row addresses having identical q low-order bits and different p high-order bits from each other may be included in different memory banks of the memory cell array 280 from each other.

In FIG. 11, the row address of the memory device 200a includes two high-order bits as an example. That is, p is two in the example of FIG. 11. However, example embodiments are not limited thereto, and p may be any positive integer.

In FIG. 11, row addresses RAx, RAy, RAz, RAw have identical q low-order bits and different p high-order bits from each other. Therefore, the control unit 299 may refresh pages corresponding to the row addresses RAx, RAy, RAz, RAw concurrently.

Referring to FIG. 11, durations of the monitoring periods tmon for the plurality of the pages included in the memory device 200a may be different from each other, and the duration of the monitoring period tmon for each of the plurality of the pages included in the memory device 200a may correspond to one of one through m refresh intervals tREFI. In this case, the control unit 299 may concurrently generate, at every m turns of the refresh interval tREFI, m candidate refresh addresses RCA corresponding to pages scheduled to be refreshed within m times of the refresh interval tREFI.

For example, as illustrated in FIG. 11, the control unit 299 may concurrently generate m candidate refresh addresses RCA as row addresses having q low-order bits identical with q low-order bits of row addresses RA(x+1), RA(y+1), RA(z+1), RA(w+1), RA(x+2), RA(y+2), RA(z+2), RA(w+2), RA(x+3), RA(y+3), RA(z+3), RA(w+3), ..., RA(x+m), RA(y+m), RA(z+m), RA(w+m), which correspond to pages scheduled to be refreshed within m times of the refresh interval tREFI, while pages corresponding to row addresses RAx, RAy, RAz, RAw are refreshed.

Therefore, a duration of the monitoring period tmon of the row addresses RA(x+1), RA(y+1), RA(z+1), RA(w+1) may correspond to one refresh interval tREFI, a duration of the monitoring period tmon of the row addresses RA(x+2), RA(y+2), RA(z+2), RA(w+2) may correspond to two times of the refresh interval tREFI, a duration of the monitoring period tmon of the row addresses RA(x+3), RA(y+3), RA(z+3), RA(w+3) may correspond to three times of the refresh interval tREFI, and a duration of the monitoring period tmon of the row addresses RA(x+m), RA(y+m), RA(z+m), RA(w+m) may correspond to m times of the refresh interval tREFI.

The control unit 299 may monitor, at every turn of the refresh interval tREFI, whether the active command ACT is processed for at least one of the m candidate refresh addresses RCA, the monitoring period tmon of which is not yet passed. For example, the control unit 299 may monitor whether the active command ACT is processed for the at least one of the m candidate refresh addresses RCA, the monitoring period tmon of which is not yet passed, by comparing the active row address ROW_ADDR received together with the active command ACT from the memory controller 100 with the at least one of the m the candidate refresh addresses RCA, the monitoring period tmon of which is not yet passed, at every turn of the refresh interval tREFI.

When q low-order bits of the candidate refresh address RCA is different from q low-order bits of the active row address ROW_ADDR, the control unit 299 may decide that the active command ACT is not processed for the candidate refresh address RCA. When q low-order bits of the candidate refresh address RCA is identical with q low-order bits of the active row address ROW_ADDR, the control unit 299 may determine on which one of $2^p$ row addresses having q low-order bits identical with q low-order bits of the candidate refresh address RCA the active command ACT is processed by comparing p high-order bits of the candidate refresh address RCA with p high-order bits of the active row address ROW_ADDR.

In addition, the control unit 299 may determine, at every refresh interval tREFI, whether the active command ACT is processed at least once on a current candidate refresh address, which corresponds to a page scheduled to be refreshed at current refresh interval tREFI, among the m candidate refresh addresses RCA during the monitoring period tmon of the current candidate refresh address. The control unit 299 may concurrently refresh pages corresponding to $2^p$ row addresses that have q low-order bits identical with q low-order bits of the candidate refresh address RCA when q low-order bits of the candidate refresh address RCA is different from q low-order bits of the active row address ROW_ADDR received from the memory controller 100 during the monitoring period tmon of the current candidate refresh address. The control unit 299 may concurrently refresh pages corresponding to row addresses that have q low-order bits identical with q low-order bits of the candidate refresh address RCA and p high-order bits different from p high-order bits of the active row address ROW_ADDR when q low-order bits of the candidate refresh address RCA is identical with q low-order bits of the active row address ROW_ADDR received from the memory controller 100 during the monitoring period tmon of the current candidate refresh address.

For example, as illustrated in FIG. 11, the active command ACT may be processed for the row address RA(y+2) at a time t1, on the row address RA(w+3) at a time t2 and on the row address RA(x+m) at a time t3. In this case, at a time t4, the control unit 299 may refresh pages corresponding to all of row addresses RA(x+1), RA(y+1), RA(z+1), RA(w+1) having q low-order bits identical with q low-order bits of the current candidate refresh address at the time t4, since the active command ACT is not processed for the row addresses RA(x+1), RA(y+1), RA(z+1), RA(w+1) during the monitoring period tmon of the row addresses RA(x+1), RA(y+1), RA(z+1), RA(w+1). At a time t5, the control unit 299 may refresh pages corresponding to row addresses RA(x+2), RA(z+2), RA(w+2) among row addresses RA(x+2), RA(y+2), RA(z+2), RA(w+2) having q low-order bits identical with q low-order bits of the current candidate refresh address at the time t5, since the active command ACT is processed for the row address RA(y+2) at the time t1, which is in the middle of the monitoring period tmon of the row addresses RA(x+2), RA(y+2), RA(z+2), RA(w+2). At a time t6, the control unit 299 may refresh pages corresponding to row addresses RA(x+3), RA(y+3), RA(z+3) among row addresses RA(x+3), RA(y+3), RA(z+3), RA(w+3) having q low-order bits identical with q low-order bits of the current candidate refresh address at the time t6, since the active command ACT is processed for the row address RA(w+3) at the time t2, which is in the middle of the monitoring period tmon of the row addresses RA(x+3), RA(y+3), RA(z+3), RA(w+3). At a time t7, the control unit 299 may refresh pages corresponding to row addresses RA(y+m), RA(z+m), RA(w+m) among row addresses RA(x+m), RA(y+m), RA(z+m), RA(w+m) having q low-order bits identical with q low-order bits of the current candidate refresh address at the time t7, since the active command ACT is processed for the row address RA(x+m) at the time t3, which is in the middle of the monitoring period tmon of the row addresses RA(x+m), RA(y+m), RA(z+m), RA(w+m).

The control unit 299 may include the refresh address generator 500 of FIG. 10 for performing the method of refreshing described with reference to FIG. 11. In this case, each of the first through m-th monitoring units 550-1, 550-2, 550-3, . . . , 550-m included in the refresh address generator 500 may be implemented with the monitoring unit 450 of FIG. 8.

Figure 12:
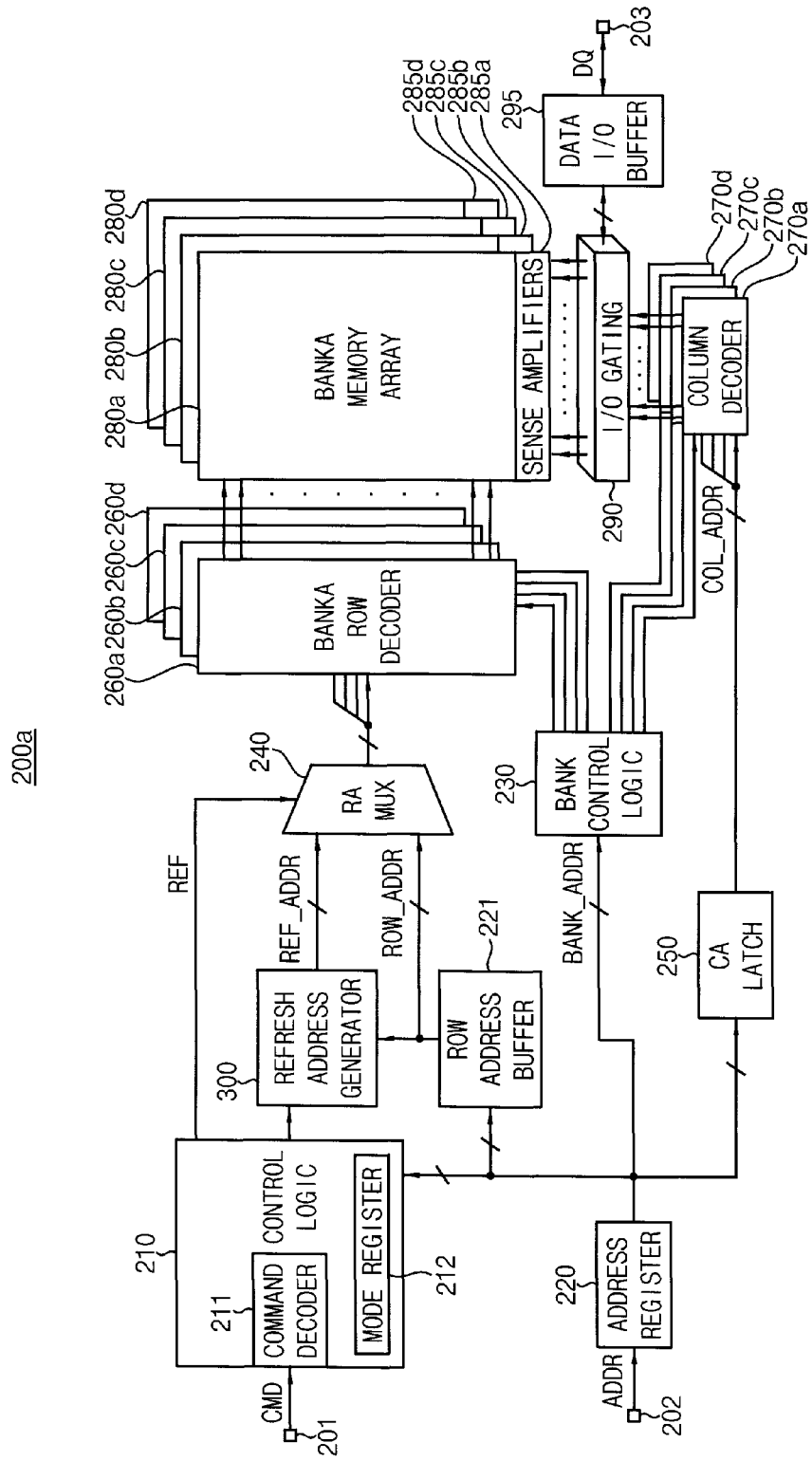
FIG. 12 is a block diagram illustrating an example of a memory device included in the memory system of FIG. 2 according to example embodiments.

FIG. 12 is a block diagram illustrating an example of a memory device included in the memory system of FIG. 2 according to example embodiments.

Referring to FIG. 12, the memory device 200a includes a control logic 210, an address register 220, a row address buffer 221, a bank control logic 230, a row address multiplexer 240, a column address latch 250, a row decoder, a column decoder, a memory cell array, a sense amplifier unit, an input/output gating circuit 290, a data input/output buffer 295 and a refresh address generator 300.

The memory cell array may include first through fourth bank arrays 280a, 280b, 280c and 280d. Each of the first through fourth bank arrays 280a, 280b, 280c and 280d may include a plurality of memory blocks. Each of the plurality of memory blocks may include a plurality of pages. For example, one page may include one row of memory cells.

The row decoder may include first through fourth bank row decoders 260a, 260b, 260c and 260d respectively coupled to the first through fourth bank arrays 280a, 280b, 280c and 280d. The column decoder may include first through fourth bank column decoders 270a, 270b, 270c and 270d respectively coupled to the first through fourth bank arrays 280a, 280b, 280c and 280d. The sense amplifier unit may include first through fourth bank sense amplifiers 285a, 285b, 385c and 385d respectively coupled to the first through fourth bank arrays 280a, 280b, 280c and 280d.

The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the memory device 200a is illustrated in FIG. 12 as including four banks, the memory device 200a may include any number of banks.

The control logic 210 may control operations of the memory device 200a. For example, the control logic 210 may generate control signals for the memory device 200a to perform a write operation or a read operation. The control logic 210 may include a command decoder 211 that decodes the command signal CMD received from the memory controller 100 through the command pin 201 and a mode register 212 that is used to set an operation mode of the memory device 200a. For example, the command decoder 211 may generate the control signals corresponding to the command signal CMD by decoding a write enable signal (/WE), a row address strobe signal (/RAS), a column address strobe signal (/CAS), a chip select signal (/CS), etc. The control logic 210 may further receive a clock signal (CLK) and a clock enable signal (/CKE) for operating the memory device 200a in a synchronous manner. In addition, the control logic 210 may control the refresh address generator 300 such that the refresh address generator 300 generates a refresh row address REF_ADDR on which a refresh operation is performed. The control logic 210 may output an activated refresh signal REF while performing the refresh operation and output a deactivated refresh signal REF after finishing the refresh operation.

The address register 220 may receive the address signal ADDR including a bank address BANK_ADDR, an active row address ROW_ADDR and a column address COL_ADDR from the memory controller 100 through the address pin 202. The address register 220 may provide the bank address BANK_ADDR to the bank control logic 230, provide the active row address ROW_ADDR to the row address buffer 221, and provide the column address COL_ADDR to the column address latch 250.

The address buffer 221 may temporary store the active row address ROW_ADDR and provide the active row address ROW_ADDR to the refresh address generator 300 and to the row address multiplexer 240.

The refresh address generator 300 may generate the refresh row address REF_ADDR on which a refresh operation is performed based on the active row address ROW_ADDR under a control of the control logic 210. The refresh address generator 300 may be embodied with one of the refresh address generator 400 of FIG. 6 and the refresh address generator 500 of FIG. 10. A structure and an operation of the refresh address generator 400 of FIG. 6 and the refresh address generator 500 of FIG. 10 may be the same as described above with reference to FIGS. 6 and 10. Therefore, a detailed description of the refresh address generator 300 is omitted.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the active row address ROW_ADDR from the row address buffer 221 and receive the refresh row address REF_ADDR from the refresh address generator 300. The row address multiplexer 240 may output one of the active row address ROW_ADDR and the refresh row address REF_ADDR in response to the refresh signal REF received from the control logic 210. For example, the row address multiplexer 240 may output the refresh row address REF_ADDR when the refresh signal REF is activated, and output the active row address ROW_ADDR when the refresh signal REF is deactivated. A row address output from the row address multiplexer 240 may be applied to the first through fourth bank row decoders 260a, 260b, 260c and 260d.

The activated one of the first through fourth bank row decoders 260a, 260b, 260c and 260d may decode the row address received from the row address multiplexer 240 and activate a page coupled to a word line corresponding to the row address. For example, the activated bank row decoder may apply a word line driving voltage to the word line corresponding to the row address. In some example embodiments, the first through fourth bank row decoders 260a, 260b, 260c and 260d may receive the refresh row address REF_ADDR including the candidate refresh address RCA and the refresh determination bit from the row address multiplexer 240 in a refresh mode, and refresh pages corresponding to all or some of $2^p$ row addresses having q low-order bits identical with q low-order bits of the candidate refresh address RCA based on the refresh determination bit.

The column address latch 250 may receive the column address COL_ADDR from the address register 220 and temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR received from the column address latch 250 and control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data received from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array and be stored in the read data latches. The data DQ stored in the read data latches may be provided to the memory controller 100 via the data input/output buffer 295 and the data pin 203. Data DQ to be written to one bank array of the first through fourth bank arrays 280a, 280b, 280c and 280d may be provide from the memory controller 100 to the data input/output buffer 295 via the data pin 203. The data DQ provided to the data input/output buffer 295 may be written to the one bank array via the write drivers.

As described above with reference to FIGS. 1 to 12, in the method of refreshing in the memory device 200a having the plurality of pages according to some example embodiments, the memory device 200a may generate the candidate refresh address RCA corresponding to a page scheduled to be refreshed after the monitoring period tmon, a duration of which may correspond to multiple times of the refresh interval tREFI. The memory device 200a may monitor whether the active command ACT is received from the memory controller 100 and/or if an activation is performed on a page corresponding to the candidate refresh address RCA during the monitoring period tmon. The memory device 200a may skip the refresh of a page corresponding to a candidate refresh address RCA when the active command ACT is received and/or activation is performed on the candidate refresh address RCA at least once during the monitoring period tmon of the candidate refresh address RCA. The memory device 200a may refresh a page corresponding to a candidate refresh address RCA when the active command ACT is not received and/or activation is not performed on the candidate refresh address RCA during the monitoring period tmon of the candidate refresh address RCA. Therefore, the memory device 200a may selectively refresh pages that are scheduled to be refreshed and may skip the refreshing of pages that do not require to be refreshed even if a refresh operation had been scheduled. As such, a refresh rate of the memory device 200a may decrease without degrading the reliability of the memory device 200a and power consumption of the memory device 200a may decrease.

In some example embodiments, the control unit 299 may calculate an average of a number of pages refreshed at every turn of the refresh interval tREFI, and vary the duration of the monitoring periods tmon based on the average. For example, the control unit 299 may increase the duration of the monitoring period tmon when the average is relatively large, and decrease the duration of the monitoring period tmon when the average is relatively small. Therefore, the power consumption of the memory device 200a caused by the refresh operation may further decrease. If the duration of the monitoring period tmon is longer than the refresh period tREF, which is described above with reference to FIG. 3, data stored in a memory cell may be lost. Therefore, the control unit 299 may vary the duration of the monitoring periods tmon within the refresh period tREF.

Figure 13:
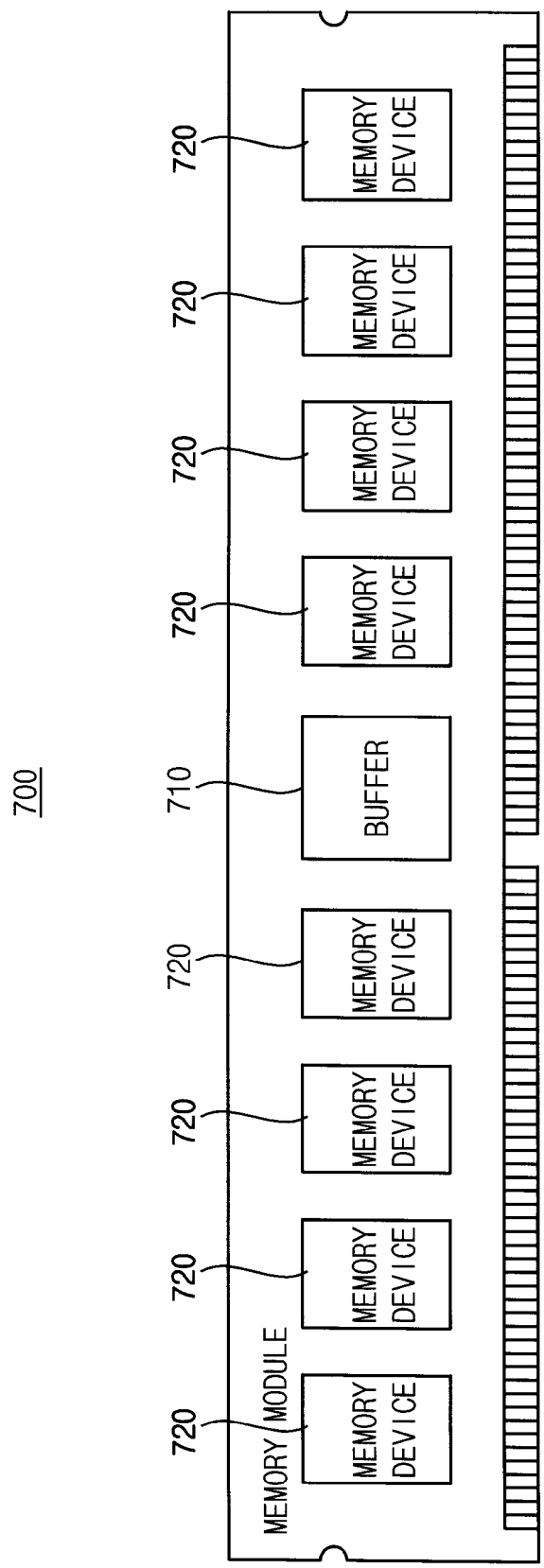
FIG. 13 is a block diagram illustrating a memory module according to exemplary embodiments.

FIG. 13 is a block diagram illustrating a memory module according to exemplary embodiments.

Referring to FIG. 13, a memory module 700 may include a plurality of memory devices 720. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 710 that receives a command signal, an address signal and data from a memory controller through a plurality of transmission lines and buffers the command signal, the address signal and the data to provide the plurality of memory devices 720 with the command signal, the address signal and the data.

In some example embodiments, data transmission lines between the buffer 710 and the plurality of memory devices 720 may be coupled in a point-to-point topology. Command transmission lines and address transmission lines between the buffer 710 and the plurality of memory devices 720 may be coupled in a multi-drop topology, a daisy-chain topology, a fly-by daisy-chain topology, or the like. Since the buffer 710 buffers the command signal, the address signal and the data, the memory controller may interface with the memory module 700 by driving only a load of the buffer 710. Accordingly, the memory module 700 may include more memory devices 720 and/or more memory ranks, and a memory system may include more memory modules 700.

Each of the memory devices 720 may generate a candidate refresh address corresponding to a page scheduled to be refreshed after a monitoring period, a duration of which corresponds to multiple times of the refresh interval tREFI. The memory devices 720 may monitor whether an active command received from a memory controller is processed for a page corresponding to the candidate refresh address during the monitoring period. The memory devices 720 may skip the refresh of a page corresponding to the candidate refresh address when the active command is received and/or activation is performed on the candidate refresh address at least once during the monitoring period of the candidate refresh address, and refresh the page corresponding to the candidate refresh address when the active command is not processed for the candidate refresh address during the monitoring period of the candidate refresh address. Therefore, the memory devices 720 may selectively refresh pages that require to be refreshed and may not refresh pages that do not require to be refreshed. As such, a refresh rate of the memory devices 720 may decrease without degrading the reliability of the memory devices 720 and power consumption of the memory device 720 caused by a refresh operation may decrease. The memory devices 720 may be the same as those described elsewhere herein, such as being embodied by the memory device 200*a* of FIG. 2. A structure and an operation of the memory device 200*a* are described above with reference to FIGS. 1 to 12. Therefore, a detail description of the memory device 720 will be omitted.

Figure 14:
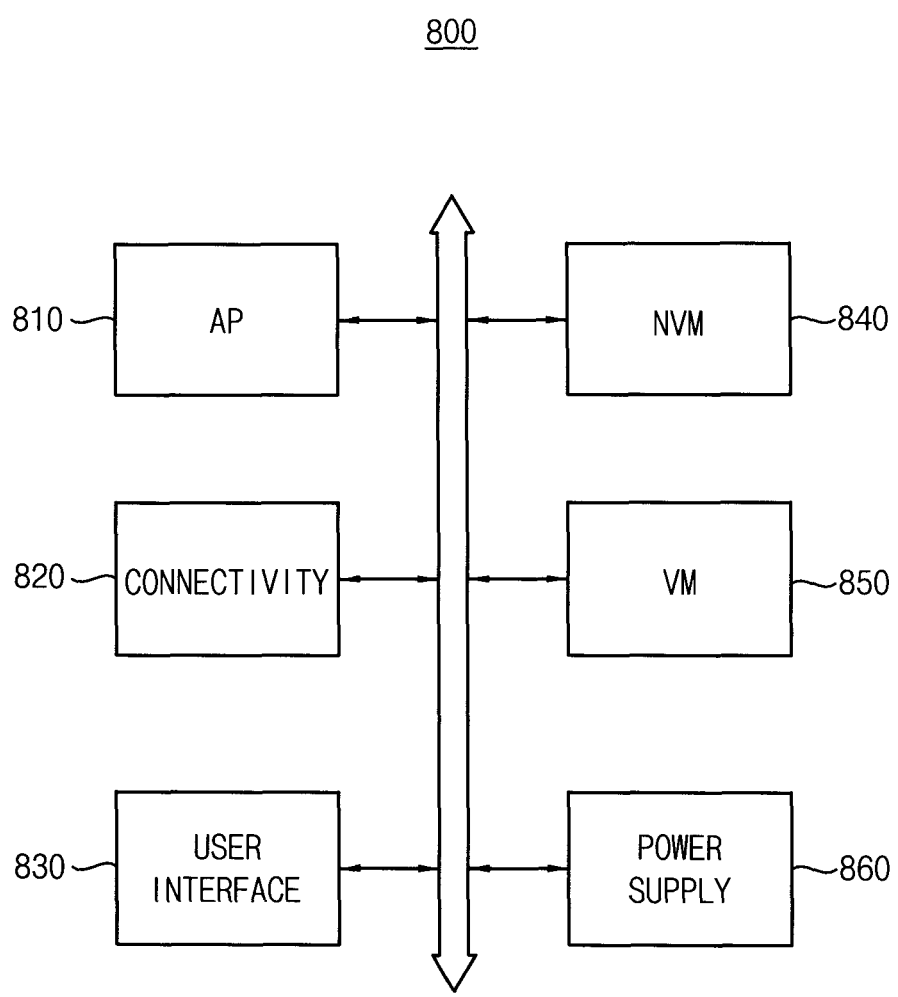
FIG. 14 is a block diagram illustrating a mobile system according to exemplary embodiments.

FIG. 14 is a block diagram illustrating a mobile system according to exemplary embodiments.

Referring to FIG. 14, a mobile system 800 includes an application processor 810, a connectivity unit 820, a user interface 830, a nonvolatile memory device NVM 840, a volatile memory device VM 850 and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 may generate a candidate refresh address corresponding to a page scheduled to be refreshed after a monitoring period, a duration of which corresponds to multiple times of the refresh interval tREFI. The volatile memory device 850 may monitor whether an active command received from a memory controller is processed for a page corresponding to the candidate refresh address during the monitoring period. The volatile memory device 850 may not refresh the page corresponding to the candidate refresh address when the active command is processed for the candidate refresh address at least once during the monitoring period of the candidate refresh address, and refresh the page corresponding to the candidate refresh address when the active command is not processed for the candidate refresh address during the monitoring period of the candidate refresh address. Therefore, the volatile memory device 850 may selectively refresh pages that are scheduled to be refreshed and may not refresh pages that do not require to be refreshed. As such, a refresh rate of the volatile memory device 850 may decrease without degrading the reliability of the volatile memory device 850 and power consumption of the volatile memory device 850 caused by a refresh operation may decrease. The volatile memory device 850 may be those described herein, such as that embodied by the memory device 200*a* of FIG. 2. A structure and an operation of the memory device 200*a* are described above with reference to FIGS. 1 to 12. Therefore, a detail description of the volatile memory device 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 15:
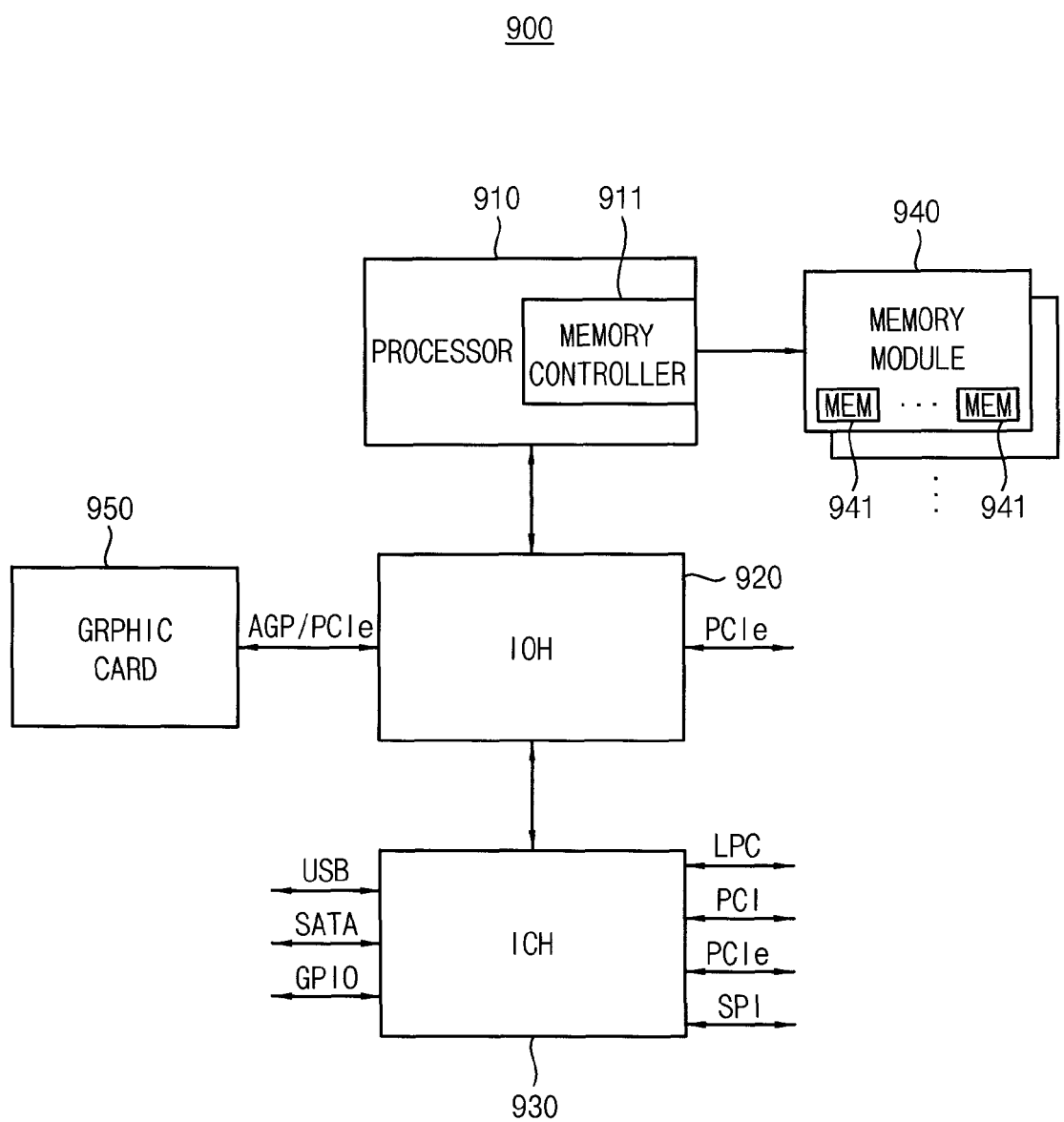
FIG. 15 is a block diagram illustrating a computing system according to exemplary embodiments.

FIG. 15 is a block diagram illustrating a computing system according to exemplary embodiments.

Referring to FIG. 15, a computing system 900 includes a processor 910, an input/output hub (IOH) 920, an input/output controller hub (ICH) 930, at least one memory module 940 and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 15 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The memory device 941 may generate a candidate refresh address corresponding to a page scheduled to be refreshed after a monitoring period, a duration of which corresponds to multiple times of the refresh interval tREFI. The memory device 941 may monitor whether an active command received from a memory controller is processed for a page corresponding to the candidate refresh address during the monitoring period. The memory device 941 may not refresh the page corresponding to the candidate refresh address when the active command is processed for the candidate refresh address at least once during the monitoring period of the candidate refresh address, and refresh the page corresponding to the candidate refresh address when the active command is not processed for the candidate refresh address during the monitoring period of the candidate refresh address. Therefore, the memory device 941 may selectively refresh pages that require to be refreshed and may not refresh pages that do not require to be refreshed. As such, a refresh rate of the memory device 941 may decrease without degrading the reliability of the memory device 941 and power consumption of the memory device 941 caused by a refresh operation may decrease. The memory device 941 may be any of those described herein, such as that embodied by the memory device 200a of FIG. 2. A structure and an operation of the memory device 200a are described above with reference to FIGS. 1 to 12. Therefore, a detail description of the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 15 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of refreshing in a memory device having a plurality of pages, comprising:

scheduling a page to be refreshed after a monitoring period, comprising generating a candidate refresh address of the page scheduled to be refreshed;

monitoring whether an active command is processed for the candidate refresh address during the monitoring period; and skipping a refresh of the page scheduled to be refreshed when an active command has been processed for the candidate refresh address during the monitoring period.

2. The method of claim 1, wherein monitoring whether the active command is processed for the candidate refresh address during the monitoring period includes:

comparing the candidate refresh address with an active row address received together with the active command from an external device during the monitoring period.

3. The method of claim 2, wherein a number of bits included in a row address of the memory device is (p+q), and the row address of the memory device includes p high-order bits and q low-order bits, p and q being positive integers, and wherein bit line sense and amplification operation is performed concurrently and independently on pages corresponding to $2^0 p$ row addresses having identical q low-order bits and different p high-order bits from each other.

4. The method of claim 3, wherein pages having identical q low-order bits and different p high-order bits from each other are located in different memory blocks of the memory device from each other.

5. The method of claim 3, wherein pages having identical q low-order bits and different p high-order bits from each other are located in different memory banks of the memory device from each other.

6. The method of claim 3, wherein comparing the candidate refresh address with the active row address received together with the active command from the external device during the monitoring period includes:

comparing q low-order bits of the candidate refresh address with q low-order bits of the active row address received during the monitoring period; and comparing p high-order bits of the candidate refresh address with p high-order bits of the active row address when q low-order bits of the candidate refresh address is identical with q low-order bits of the active row address.

7. The method of claim 6, wherein skipping the refresh of the page scheduled to be refreshed when an active command has been processed for the candidate refresh address during the monitoring period comprises concurrently refreshing pages corresponding to row addresses that have q low-order bits identical with q low-order bits of the candidate refresh address and p high-order bits different from p high-order bits of an active row address received with the active command when the q low-order bits of the candidate refresh address are identical with q low-order bits of the active row address.

8. The method of claim 1, further comprising:

scheduling multiple pages to be refreshed after a corresponding monitoring period, comprising generating multiple candidate refresh addresses, each corresponding to a page scheduled to be refreshed;

monitoring whether an active command is processed for any of the candidate refresh addresses during the corresponding monitoring period;

skipping a refresh of a page scheduled to be refreshed of the multiple pages scheduled to be refreshed when an active command has been processed for the corresponding candidate refresh address during the corresponding monitoring period.

9. The method of claim 8, wherein durations of the monitoring periods for the multiple pages scheduled to be refreshed are the same.

10. The method of claim 8, further comprising generating a candidate refresh address at a rate of one per refresh interval.

11. The method of claim 10, wherein each monitoring period corresponds to m refresh intervals, wherein m is an integer equal to or greater than 2.

12. The method of claim 8, wherein durations of the monitoring periods are different from each other.

13. The method of claim 12, wherein generating the candidate refresh addresses comprises generating, at every mth refresh interval, m candidate refresh addresses corresponding to pages scheduled to be refreshed within m times the refresh interval, and wherein m is an integer equal to or greater than 2.

14. The method of claim 1, further comprising:

increasing the duration of the monitoring period when an average of a number of pages refreshed at every refresh period is relatively large; and decreasing the duration of the monitoring period when the average is relatively small.

15. A memory device, comprising:

a memory cell array including a plurality of pages; and a control unit configured to generate a candidate refresh address corresponding to a page scheduled to be refreshed after a monitoring period, configured to monitor whether an active command is processed for the candidate refresh address during the monitoring period, configured to refresh the page corresponding to the candidate refresh address when no active command is processed for the candidate refresh address during the monitoring period, and configured to skip a scheduled refresh of the page corresponding to the candidate refresh address when an active command has been processed for the candidate refresh address during the monitoring period.

16. The memory device of claim 15, wherein the control unit is configured to concurrently refresh pages corresponding to row addresses that have q low-order bits identical with q low-order bits of the candidate refresh address when q low-order bits of the candidate refresh address are different from q low-order bits of any active row address received together with an active command from an external device during the monitoring period, and configured to concurrently refresh pages corresponding to row addresses that have q low-order bits identical with q low-order bits of the candidate refresh address and p high-order bits different from p high-order bits of a received active row address when q low-order bits of the candidate refresh address are identical with q low-order bits of the received active row address received from the external device during the monitoring period, p and q being positive integers.

17. The memory device of claim 15, wherein pages having identical q low-order bits and p high-order bits that are different from each other are located in different memory blocks of the memory cell array from each other.

18. A method of refreshing a memory device, comprising:

in the memory device, generating refresh addresses at regular refresh intervals, the refresh addresses corresponding to memory locations scheduled to be refreshed;

for each generated refresh address, after generating the corresponding refresh address, monitoring whether a separate command is processed to activate the memory location corresponding to the refresh address; and for each generated refresh address, if a separate command has been processed to activate the memory location corresponding to the refresh address prior to the scheduled refresh of the corresponding memory location, skipping the scheduled refresh of the corresponding memory location.

19. The method of claim 18, wherein, for each generated refresh address, after generating the corresponding refresh address, the monitoring of the processing of a separate command is for a predetermined period after generating the corresponding refresh address.

20. The method of claim 19, wherein the predetermined period is the same for each of the generated corresponding refresh addresses.

* * * * *